US007788561B2

(12) United States Patent
Huang et al.

(10) Patent No.: US 7,788,561 B2
(45) Date of Patent: Aug. 31, 2010

(54) DIAGNOSING MIXED SCAN CHAIN AND SYSTEM LOGIC DEFECTS

(76) Inventors: Yu Huang, 89 Ewald Ave., Marlborough, MA (US) 01752; Wu-Tung Cheng, 19030 SW. 35th Pl., Lake Oswego, OR (US) 97034; Ruifeng Guo, 12504 NW. Forest Spring La., Portland, OR (US) 97229

( * ) Notice: Subject to any disclaimer, the term of this patent is extended or adjusted under 35 U.S.C. 154(b) by 433 days.

(21) Appl. No.: 11/838,858

(22) Filed: Aug. 14, 2007

(65) Prior Publication Data

US 2008/0040637 A1    Feb. 14, 2008

Related U.S. Application Data

(60) Provisional application No. 60/837,890, filed on Aug. 14, 2006, provisional application No. 60/932,857, filed on Jun. 1, 2007.

(51) Int. Cl.
*G01R 31/28* (2006.01)
(52) U.S. Cl. .............................. 714/729; 714/3; 714/8; 714/25; 714/30; 714/31; 714/37; 714/48; 714/709; 714/723; 714/724; 714/726; 714/727; 714/742; 702/183; 702/185; 703/13; 703/14; 703/15
(58) Field of Classification Search ........................ None
See application file for complete search history.

(56) References Cited

U.S. PATENT DOCUMENTS

| 7,523,370 | B1 * | 4/2009 | Keller ........................ 714/726 |
| 2005/0060625 | A1 * | 3/2005 | Wang et al. ................. 714/727 |
| 2005/0097419 | A1 * | 5/2005 | Rajski et al. ................. 714/742 |
| 2005/0222816 | A1 | 10/2005 | Cheng et al. |
| 2005/0240848 | A1 * | 10/2005 | Cote et al. .................... 714/726 |
| 2006/0111873 | A1 | 5/2006 | Huang et al. |
| 2006/0156122 | A1 * | 7/2006 | Wang et al. .................. 714/726 |
| 2007/0234150 | A1 * | 10/2007 | Jain et al. .................... 714/726 |

OTHER PUBLICATIONS

Crouch et al., "Debugging and Diagnosing Scan Chains", EDFAS, vol. 7 pp. 16-24, Feb. 2005.*
Narayanan et al., "An Efficient Scheme to Diagnose Scan Chains", ITC, pp. 704-713, 1997.*
Cheng et al., "Compactor Independent Direct Diagnisis", IEEE ATS, Nov. 15-17, 2004.*

(Continued)

*Primary Examiner*—John P Trimmings
(74) *Attorney, Agent, or Firm*—Klarquist Sparkman, LLP

(57) ABSTRACT

Technologies disclosed herein can be used to diagnose defects on die having both scan chain and system logic defects, including in situations where the presence of one or more faults in the system logic potentially obscures the detectability of one or more faults in the scan chains (or channels) and vice versa. At least some embodiments employ an iterative approach where at least some scan chain faults are identified, these chain faults are used to identify system logic faults, and then additional chain faults are identified using the system logic faults and vice versa. Failing bits can be partitioned into at least two groups: failing bits determined as being caused by system logic failures, and failing bits determined as being possibly caused by chain defects, system logic defects, or the compound effects of both types of defects.

60 Claims, 18 Drawing Sheets

OTHER PUBLICATIONS

Akers et al., "Why is Less Information From Logic Simulation More Useful in Fault Simulation?," *International Test Conference*, pp. 786-800 (1990).

Cheng et al., "Compactor Independent Direct Diagnosis," *IEEE Proceedings of the 13th Asian Test Symposium* (Nov. 15-17, 2004).

Cox et al., "A Method of Fault Analysis for Test Generation and Fault Diagnosis," *IEEE Trans. on CAD*, vol. 7:7, pp. 813-833 (1988).

Crouch, "Debugging and Diagnosing Scan Chains," *EDFAS*, vol. 7 pp. 16-24 (Feb. 2005).

Edirisooriya et al., "Diagnosis of Scan Path Failures," *Proc. VLSI Test Symposium*, pp. 250-255 (1995).

Guo et al., "A Technique for Fault Diagnosis of Defects in Scan Chains," *International Test Conference*, pp. 268-277 (2001).

Huang et al., "Diagnosing DACS (Defects That Affect Scan Chain and System Logic)," *International Symposium on Testing and Failure Analysis*, pp. 191-196 (Nov. 2-6, 2004).

Huang et al., "Statistical Diagnosis for Intermittent Scan Chain Hold-Time Fault," *International Test Conference*, pp. 319-328 (Sep. 30-Oct. 2, 2003).

Huang et al., "Compound Defects Diagnosis with Non-Compressed Patterns," *European Test Symposium, Freiburg, Germany* (May 20-24, 2007).

Huang et al., "Compound Defects Diagnosis with Non-Compressed Patterns," Powerpoint Presentation, *European Test Symposium, Freiburg, Germany*, May 23, 2007.

Huang et al., "Compressed Pattern Diagnosis For Scan Chain Failures," *International Test Conference*, pp. 744-751 (Nov. 8-10, 2005).

Huang et al., "Diagnose Compound Scan Chain and System Logic Defects," *International Test Conference* (Oct. 23, 2007).

Huang, "On Improving the Accuracy of Multiple Defect Diagnosis," *VLSI Test Symposium, 19th IEEE Proceedings on. VTS 2001*, pp. 34-39 (Apr. 29-May 3, 2001).

Kundu, "Diagnosing Scan Chain Faults," *IEEE Transactions on VLSI Systems*, vol. 2:4, pp. 512-516 (1994).

Narayanan et al., "An Efficient Scheme to Diagnose Scan Chains," *International Test Conference*, pp. 704-713 (1997).

Rajski et al., "Embedded Deterministic Test for Low-Cost Manufacturing," *International Test Conference*, pp. 301-310 (2002).

Richman et al., "The Modern Fault Dictionary," *International Test Conference*, pp. 696-702 (1985).

Schafer et al., "Partner SRLs for Improved Shift Register Diagnostics," *Proc. VLSI Test Symposium*, pp. 198-201 (1992).

Wang et al., "Analysis and Methodology for Multiple-Fault Diagnosis," *IEEE Transactions on Computer-Aided Design of Integrated Circuits and Systems*, pp. 558-575, vol. 25:3 (Mar. 2006).

Wu, "Diagnosis of Scan Chain Failures," *Proc. International Symposium on Defect and Fault Tolerance in VLSI Systems*, pp. 217-222 (1998).

Yang et al., "Quick Scan Chain Diagnosis Using Signal Profiling," *ICCD 2005*, pp. 157-160 (Oct. 2-5, 2005).

\* cited by examiner

DIAGNOSING MIXED SCAN CHAIN AND SYSTEM LOGIC DEFECTS

CROSS REFERENCE TO RELATED APPLICATIONS

This application claims the benefit of U.S. Provisional Patent Application No. 60/837,890, filed Aug. 14, 2006, titled "DIAGNOSING MIXED SCAN CHAIN AND SYSTEM LOGIC DEFECTS," and U.S. Provisional Patent Application No. 60/932,857, filed Jun. 1, 2007, titled "DIAGNOSING MIXED SCAN CHAIN AND SYSTEM LOGIC DEFECTS," both of which are incorporated herein by reference.

FIELD

The present application relates to diagnosing defects in electronic circuits, for example, scan chain defects and system logic defects.

BACKGROUND

Typically, scan-based diagnosis of electronic circuits comprises scan chain diagnosis and system logic diagnosis. Scan chain diagnosis targets one or more defects in one or more scan chains, while system logic diagnosis targets one or more defects in system logic coupled to the one or more scan chains. Typically, systems perform scan chain diagnosis and system logic diagnosis separately. For system logic diagnosis, it is often assumed that the scan chains are working correctly. Similarly, for software-based scan chain defect diagnosis, it is often assumed that the system logic is defect-free. Hardware-based scan chain defect diagnosis methods, by contrast, typically make no assumptions about the system logic, but require extra hardware overhead to implement special scan architectures.

It is not unusual for scan chain defects and system logic defects to co-exist on one die, resulting in so-called "compound defects" or "mixed defects." The coexistence of scan chain defects and system logic defects can complicate diagnosis, as diagnosing faulty scan chains can require verifying the functioning of the system logic, but testing the system logic can require properly functioning scan chains. To address this issue, improved fault diagnosis methods that are capable of detecting and identifying compound defects are desired.

SUMMARY

Technologies disclosed herein can be used to diagnose defects on die having both scan chain and system logic defects. Such defects are referred to herein as "compound defects" or "mixed defects," and these two terms can be used interchangeably. In some cases the presence of a scan chain defect and/or fault can obscure the presence or detectability of a system logic defect and/or fault, while in some cases the presence of a system logic defect and/or fault can obscure the presence or detectability of a scan chain defect and/or fault.

In some embodiments, a method comprises: receiving a failure log indicative of failing test bits observed during testing of an electronic circuit, the electronic circuit having at least one defect in system logic and at least one defect in a scan chain; identifying one or more fault suspects in the system logic of the electronic circuit; identifying one or more fault suspects in the at least one scan chain of the electronic circuit; and storing a description of the identified one or more fault suspects in the system logic and of the identified one or more fault suspects in the at least one scan chain in one or more computer-readable media. In further embodiments, at least one of the one or more fault suspects in the system logic obscures the detectability of at least one of the fault suspects in the at least one scan chain, or at least one of the fault suspects in the at least one scan chain obscures the detectability of at least one of the fault suspects in the system logic. In additional embodiments the one or more fault suspects in the system logic are identified before the one or more fault suspects in the at least one scan chain are identified. In some embodiments the one or more fault suspects in the at least one scan chain are identified before the one or more fault suspects in the system logic are identified. In particular embodiments the method further comprises at least one of: identifying one or more additional fault suspects in the system logic using the identified one or more fault suspects in the at least one scan chain; and identifying one or more additional fault suspects in the at least one scan chain using the identified one or more fault suspects in the system logic. In some cases, identifying one or more fault suspects in the at least one scan chain comprises masking one or more potential system logic defect signals in a representation of the electronic circuit and using a scan chain defect diagnosis technique to identify the one or more fault suspects in the at least one scan chain. Masking the one or more potential system logic defect signals in the representation of the electronic circuit can comprise identifying a set of one or more logic signals associated with the identified one or more fault suspects in the system logic and masking one or more logic gates in the electronic circuit corresponding to the identified set of one or more signals. In some embodiments, identifying the set of one or more logic signals associated with the identified one or more fault suspects in the system logic comprises identifying logic signals in one or more logic cones associated with one or more failing outputs of the system logic. Some embodiments further comprise performing at least one of a union operation or an intersection operation between the identified logic signals of at least two of the logic cones. In further embodiments, masking the one or more potential system logic defect signals in the representation of the electronic circuit comprises changing one or more logic gates associated with the one or more potential system logic defects into X-mask gates, which are defined below. In additional embodiments, identifying one or more fault suspects in the system logic comprises: receiving a description of failing bits identified as being caused by system logic defects and not by scan chain defects; receiving modified scan patterns, the modified scan patterns comprising the scan patterns used during the testing of the electronic circuit modified to mask loading and unloading values on faulty scan chains; and performing logic diagnosis using the description of the failing bits and the modified scan patterns. Such embodiments can further comprise: modifying the scan patterns used during the testing of the electronic circuit so that the loading values in scan chains comprising the fault suspects in the at least one scan chain are masked; performing a good machine simulation of the electronic circuit using the modified scan patterns; modifying good machine simulation results so that the unloading values in the scan chains comprising the fault suspects in the at least one scan chain are masked; and storing the modified loading and unloading values in one or more computer-readable media. In some embodiments the modified scan patterns are compressed scan patterns.

In further embodiments, a system comprises: a component configured to receive a failure log indicative of failing test bits observed during testing of an electronic circuit, the electronic circuit comprising system logic and one or more scan chains and having at least one defect in the system logic and at least one defect in the one or more scan chains; a component configured to identify one or more fault suspects in the system logic of the electronic circuit; and a component configured to identify one or more fault suspects in the one or more scan chains of the electronic circuit. In some embodiments the system further comprises a component configured to transmit the log indicative of failing test bits observed during the testing of the electronic circuit.

In additional embodiments, one or more computer-readable media comprise instructions configured to cause a computer to perform a method comprising: performing logic diagnosis on an electronic circuit while masking one or more faulty scan chains in the electronic circuit to produce logic diagnosis results; performing scan chain diagnosis on the electronic circuit while masking one or more system logic defects in the electronic circuit to produce scan chain diagnosis results; and storing the logic diagnosis results and the scan chain diagnosis results. In particular embodiments the method further comprises performing further logic diagnosis on the electronic circuit based at least in part on the scan chain diagnosis results. In some embodiments the method further comprises performing further scan chain diagnosis on the electronic circuit based at least in part on the logic diagnosis results. In further embodiments the electronic circuit comprises a compactor.

In yet further embodiments a method comprises: receiving a failure log indicative of failing test bits observed during testing of an electronic circuit; performing chain diagnosis for the at least one scan chain to produce chain diagnosis results, the chain diagnosis results comprising one or more scan chain fault suspects; determining scores for one or more of the scan chain fault suspects, the score for a respective one of the scan chain fault suspects indicating whether the respective scan chain fault suspect completely or partially explains the failing test bits observed; and storing the scores in one or more computer-readable media. In some embodiments the scores are determined on a pattern-by-pattern basis, while in some embodiments the scores are determined using bit-based scoring. The method can further comprise reducing the number of scan chain fault suspects from the scan chain results using the determined scores.

In particular embodiments, a method for diagnosing system logic faults in an electronic circuit comprises: receiving test results obtained by applying scan pattern loading values to the electronic circuit during testing, the test results including failing bits caused by one or more system logic defects in the electronic circuit; receiving modified scan patterns, the modified scan patterns comprising the scan pattern loading values modified such that values loaded into faulty scan chains have an unknown value, the modified scan patterns further comprising scan pattern unloading values modified such that values unloaded from the faulty scan chains have the unknown value; and performing system logic diagnosis of the electronic circuit using the failing bits caused by the one or more system logic values and the modified scan patterns. In some embodiments the scan pattern unloading values are obtained by performing a good machine simulation using the modified loading values. In further embodiments the method further comprises performing chain diagnosis of the electronic circuit using results from the system logic diagnosis. In additional embodiments the method further comprises receiving a failure log indicative of failing test bits observed during testing of the electronic circuit with the unmodified scan pattern loading values and evaluating the failing test bits in the failure log to identify the failing bits caused by the one or more system logic defects in the circuit.

In some embodiments, a method of analyzing data from a test of an electronic circuit having one or more system logic defects and one or more scan chain defects, the data indicating the presence of the one or more system logic defects and the one or more scan chain defects, comprises: identifying from the data a group of one or more failing bits determined as being caused by the one or more system logic defects; and storing the identified group of one or more failing bits in one or more computer-readable media. In further embodiments, identifying from the data a group of one or more failing bits determined as being caused by the one or more system logic defects comprises: identifying a faulty scan chain or a faulty output channel in the electronic circuit; modifying a representation of the electronic circuit such that scan cells in the identified faulty scan chain or coupled to the identified faulty output channel always output an unknown value; simulating one or more scan patterns using the modified representation to produce simulation results; and based on the simulation results, identifying the group of the one or more failing bits determined as being caused by the one or more system logic defects. In additional embodiments, identifying the group of the one or more failing bits determined as being caused by the one or more system logic defects comprises identifying a selected failure bit as being caused by the one or more system logic defects if the selected failure bit is located on a good scan chain, on a good channel, or at a primary output, and if the simulation results corresponding to the selected failure bit do not comprise an unknown value.

Any of the disclosed methods can be implemented as computer-readable media comprising computer-executable instructions for causing a computer to perform the methods. Any of the disclosed methods implemented in a computer environment can also be performed by a single computer or via a network. Further, computer-readable media storing diagnostic results or other test results (or any other final or intermediate results) produced by any of the disclosed methods are also disclosed. Electronic circuits having one or more defects, diagnosed using the disclosed technologies, can be repaired.

The foregoing and other features and advantages of the disclosed technologies will become more apparent from the following detailed description, which proceeds with reference to the accompanying figures.

DETAILED DESCRIPTION

General Considerations

Figure 1:
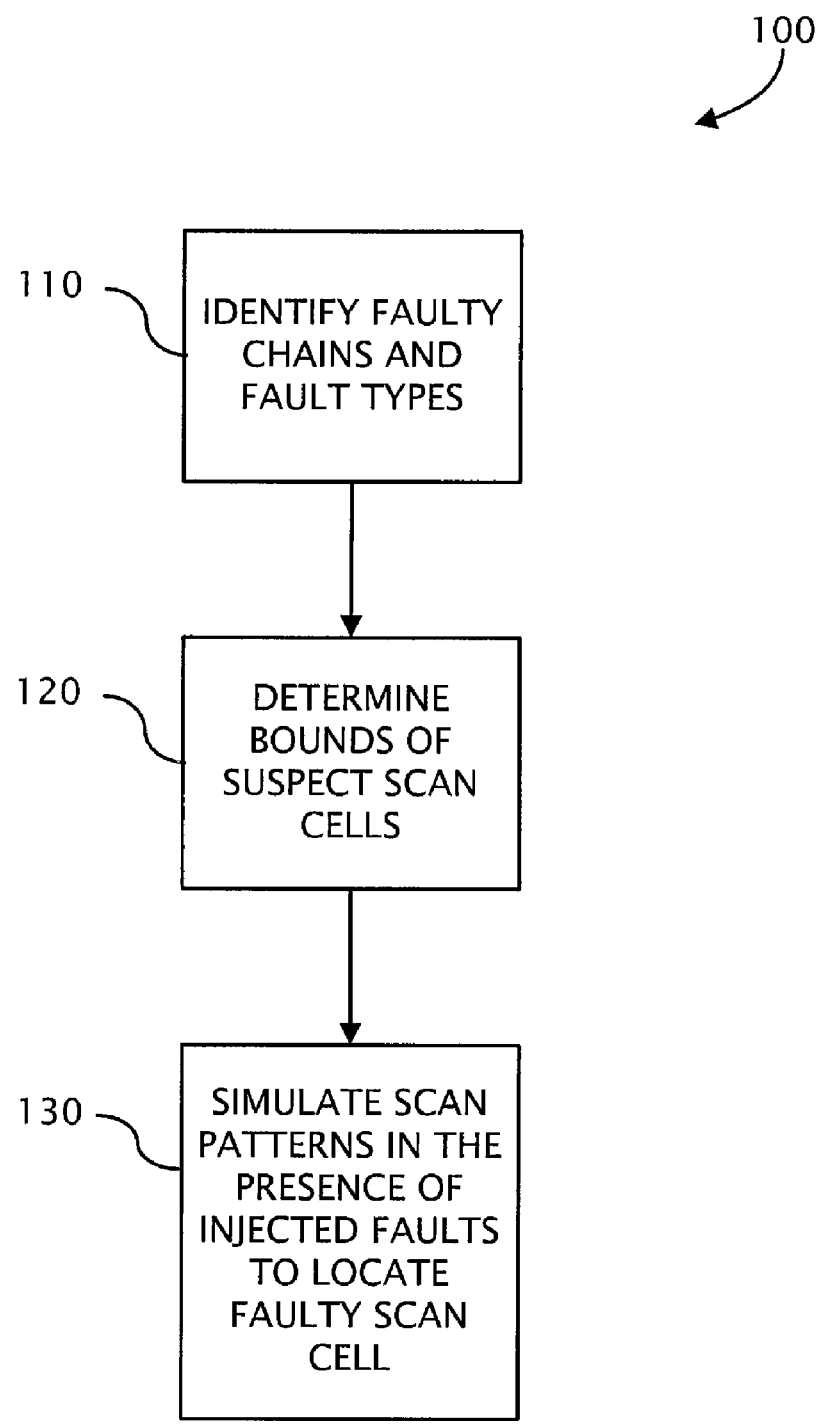
FIG. 1 shows a block diagram of one embodiment of an exemplary method of a software-based chain diagnosis procedure for designs without embedded compression hardware.

Disclosed below are representative embodiments of methods, apparatus, and systems for performing fault diagnosis that should not be construed as limiting in any way. Instead, the present disclosure is directed toward all novel and nonobvious features and aspects of the various disclosed methods, apparatus, and systems, alone and in various combinations and subcombinations with one another. The disclosed technologies are not limited to any specific aspect or feature, or combination thereof, nor do the disclosed methods, apparatus, and systems require that any one or more specific advantages be present or problems be solved.

Any of the methods, apparatus, and systems described herein can be used in conjunction with a wide variety of scan-based or partially scan-based circuits. Further, the fault suspects (or fault candidates) identified need not be of a particular type, but can vary from implementation to implementation (e.g., stuck-at faults, transition faults, bridging faults, and other such faults).

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "determine" and "identify" to describe the disclosed technologies. These terms are high-level abstractions of the actual operations that are performed. The actual operations that correspond to these terms may vary depending on the particular implementation and are readily discernible by one of ordinary skill in the art.

The disclosed embodiments can be implemented in a wide variety of environments. For example, any of the disclosed techniques can be implemented in software comprising computer-executable instructions stored on computer-readable media (e.g., one or more CDs, volatile memory components (such as DRAM or SRAM), or nonvolatile memory components (such as hard drives)). Such software can comprise, for example, electronic design automation ("EDA") software (e.g., an automatic test pattern generation ("ATPG") tool, yield analysis tool, or diagnosis tool) used to diagnose test results captured during production testing of one or more integrated circuits. One or more computer-implements components can be used to perform one or more method acts of the disclosed methods, for example, as components of a system or apparatus. The foregoing software implementations should not be construed as limiting in any way, however, as the principles disclosed herein are generally applicable to other software tools.

Any of the software embodiments described above can be executed in a single computer, a networked computer, or other distributed computing environment (e.g., via the Internet, a wide-area network, a local-area network, a client-server network, or other such network). For clarity, only certain selected aspects of the software-based implementations are described. Other details that are well known in the art are omitted. For example, it should be understood that the disclosed technologies are not limited to any specific computer language, program, or computer. For the same reason, computer hardware is not described in further detail. For example, the disclosed embodiments can be implemented using a wide variety of commercially available computer languages, computer systems, and/or testing systems. Any of the disclosed methods can alternatively be implemented (partially or completely) in hardware (e.g., an ASIC, PLD, or SoC).

Intermediate or final diagnostic results produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. For example, a description of the fault suspects (or fault candidates) corresponding to the scan cells, logic gates, or nets in which defects might exist in the design-under-test and identified by the application of any of the disclosed embodiments can be stored on computer readable-media. Such diagnostic results can be created or updated at a local computer or over a network (e.g., by a server computer).

Moreover, any of the disclosed methods can be used in a computer simulation or other EDA environment where test patterns, compressed test patterns, test responses, and compressed test responses are determined or otherwise analyzed using representations of circuits, which are stored on one or more computer-readable media. For presentation purposes, the present disclosure sometimes refers to a circuit or circuit component by its physical counterpart (for example, scan chain, scan cell, logic gate, and other such terms). It should be understood, however, that any reference in the disclosure or the claims to a physical component includes both the physical component and representation of the physical component as used in simulation or other such EDA environments.

The circuit being tested can be one of a variety of different circuits, including application specific integrated circuits ("ASICs"), programmable logic devices ("PLDs") such as field-programmable gate arrays ("FPGAs"), and systems-on-a-chip ("SoCs") having digital, analog, or mixed-signal components thereon. The one or more integrated circuits being tested can be used in a vast assortment of electronic devices, ranging from portable electronics (such as cell phones, media players, and the like) to larger-scale items (such as computers, control systems, airplanes, automobiles, and the like). All such items comprising integrated circuits modified or otherwise improved using embodiments of the disclosed technologies or equivalents are considered to be within the scope of this disclosure. Circuit faults that are detected using the disclosed techniques can in some circumstances be repaired. Circuits having faults repaired after being detected by any of the disclosed embodiments are also within the scope of this disclosure. Furthermore, circuits having designs or manufacturing parameters that were modified as a result of faults being detecting using any of the disclosed embodiments are also within the scope of this disclosure.

As used in this application and in the claims, the singular forms "a," "an," and "the" include the plural forms unless the context clearly dictates otherwise. Additionally, the term "includes" means "comprises." Unless the context dictates otherwise, the term "coupled" means electrically or electromagnetically connected or linked and includes both direct connections or direct links and indirect connections or indirect links through one or more intermediate elements not affecting the intended operation of the circuit. Moreover, the phrase "hardware-based scan chain defect diagnosis" refers to a diagnosis methodology that takes advantage of some special scan chain design to diagnose defects in scan chains. The phrase "software-based scan chain defect diagnosis" refers to a diagnosis methodology for diagnosing defects in scan chains that does not use any modification of the basic scan circuitry. Instead, software-based scan chain defect diagnosis typically relies on scan chain fault models and the simulation of ATPG chain and scan patterns with injected scan chain faults. The phrase "software-based system logic defect diagnosis" refers to a diagnosis methodology for diagnosing defect in system logic that relies on system logic fault models and simulation of ATPG scan patterns with injected system logic faults. The phrase "non-compressed pattern diagnosis" refers to the diagnosis of designs with scan chains that can be directly controlled and observed but that do not have any test response compression hardware and/or test stimuli decompression hardware. The phrase "compressed pattern diagnosis" refers to the diagnosis of designs with scan chains that have test response compaction hardware. For example, the observed failures on the ATE from scan output channels may be compacted versions of what is captured in the scan cells of the circuit.

Software Based Scan Chain Diagnosis Techniques, Generally

Non-Compressed Pattern Scan Chain Diagnosis

FIG. 1 shows a block diagram of one embodiment of an exemplary method 100 of a software-based chain diagnosis procedure for designs without embedded test response compression hardware. In a method act 110, faulty chains and fault types are identified by chain patterns. In a method act 120, the upper and lower bounds of the locations of one or more suspect scan cells are determined in an identified faulty chain. In a method act 130, the faulty scan cell is located by injecting one or more faults into scan cells within the determined bounds, and simulating scan patterns. In some embodiments, the faults can be injected one cell at a time.

Figure 2:
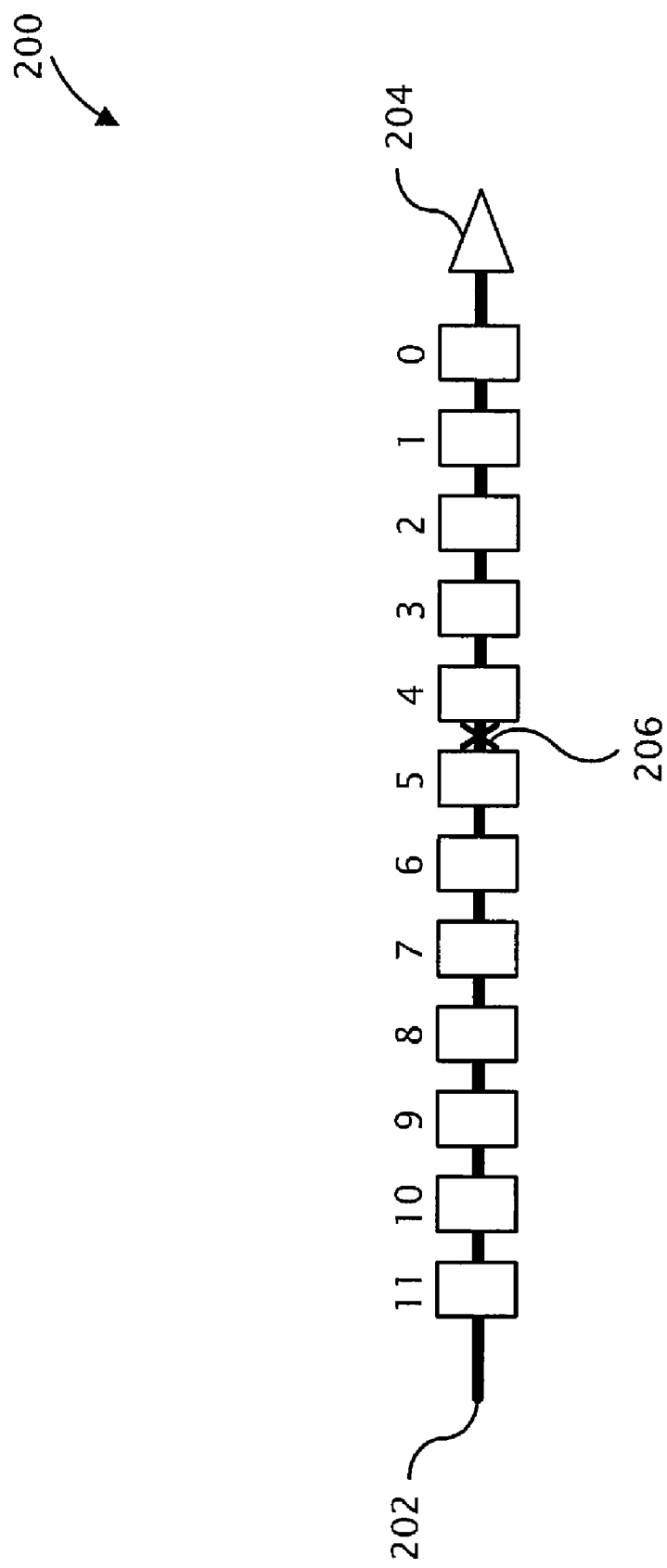
FIG. 2 shows a block diagram of a first exemplary scan chain.

The method 100 can be illustrated by an example of diagnosing a chain defect. A block diagram of an exemplary scan chain 200 coupled to system logic (not shown) appears in FIG. 2. Scan chain 200 comprises 12 scan cells numbered from 0 to 11, where cell 11 is connected to an input 202 of the chain 200 and cell 0 is connected to a scan output 204 of the chain 200. For the purposes of this example, a stuck-at 1 fault (signified by the 'X' 206) is at the output pin of cell 5 on the chain 200.

In this example, as part of the method act 110, the chain 200 is loaded with a chain pattern 001100110011, where the leftmost bit is loaded into cell 11 and the rightmost bit is loaded into cell 0. Due to the fault at the output of cell 5, the unloading values are all "1"s. It can be inferred from the chain test result that there is at least one stuck-at 1 fault on the scan chain 200, but it is unknown which scan cell has the defect.

In the method act 120, the chain 200 is masked by modifying all loading values on the chain 200 to a value representing an unknown state (e.g., "X") during scan pattern simulation. Good machine simulation is performed under the assumption that the system logic coupled to the scan chain 200 is defect-free. In this example, assume that for a given scan pattern the good machine simulation indicates that "0" is captured in cell 2 and cell 7 on the chain 200 and that the actual test results indicate that cell 7 is observed as a failing bit and cell 2 is observed as a passing bit. That is, a "0" is observed at cell 2 and a "1" at cell 7. Therefore, it is known that the captured "0" in cell 7 had been changed to a "1" during unloading when it passed by the faulty scan cell location. Hence, it can be inferred that the faulty scan cell must be somewhere between the output of cell 7 and input of cell 2. Cell 7 can be designated as the upper bound of the faulty scan cell and cell 2 the lower bound of the faulty scan cell.

In the method act 130, fault simulation with scan patterns is applied to the scan cells (for example, one cell at a time). For a suspect cell within the range determined in the method act 120, a fault is injected. Loading values in the scan cells of this faulty chain that are downstream of this scan cell (i.e., scan cells between the suspect scan cell and the scan chain output) will be modified for the scan patterns due to the fault. For example, a scan pattern can have a good machine loading value 001110011010 on the chain 200. If a stuck-at-1 fault is injected on scan cell 3, the loading value will be modified to 001110011111. After applying the capture clock, new values are captured into the faulty scan chain 200. During a scan chain unload process, the captured values in the scan cells upstream of the faulty scan cell on this faulty chain (i.e., scan cells between the suspect scan cell and the scan chain input) will be modified. For example, if the simulated captured value is 101011101000, the unloading values will be 111111111000. The simulation results are compared with the observed results from automated test equipment (ATE), and the best matching cell(s) are reported as suspect(s).

Method acts 120 and 130 are performed based on the assumption that the system logic is defect free. If this assumption is not true, the technique may not work, as illustrated below.

Figure 3:
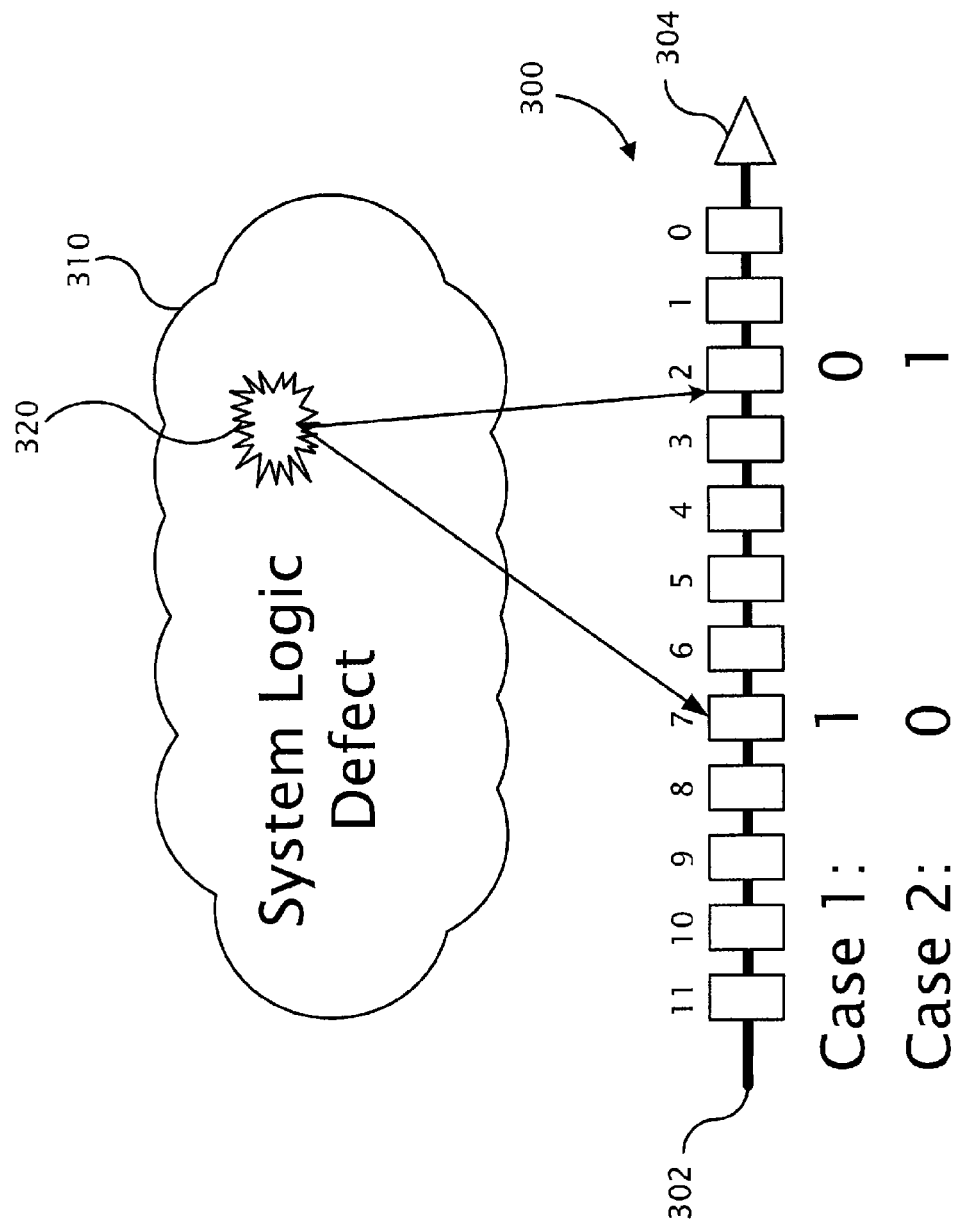
FIG. 3 shows a block diagram of a second exemplary scan chain.

FIG. 3 shows a block diagram of a scan chain 300 which, like the scan chain 200, is comprised of 12 scan cells numbered from 0 to 11, with scan cell 11 connected to an input 302 and scan cell 0 connected to a scan output 304 of the scan chain 300. The scan chain 300 is coupled to system logic 310, which in this example contains a defect 320. The scan chain 300 is loaded with the scan chain pattern 001100110011. In a first case (Case 1), the system logic defect 320 changes the captured value at cell 7 to "1" during the method act 120 of the method 100. In Case 1, a failing bit is observed at cell 7 and a passing bit is observed at cell 2. This is acceptable in this specific example because the system logic has no impact on the inference that the faulty cell is between cell 2 and cell 7. In a second case (Case 2) shown in FIG. 3, the system logic defect changes the captured value at cell 2 to "1" in the method act 120. Thus, the system logic defect 320 can lead to an incorrect conclusion that there is a stuck-at-1 fault at a scan cell downstream of cell 2 (that is, in a cell between cell 0 and cell 2).

In some cases, even if the system logic defect 320 does not affect results of the method act 120, the defect 320 can still change some bits during the method act 130. Therefore, if the simulation results do not match the observation values on ATE, it can be difficult to tell whether these mismatches are caused by injecting a scan chain defect at an incorrect scan cell or by system logic defects.

Compressed Pattern Scan Chain Diagnosis

Embedded compression techniques are commonly applied to circuit designs to help control test costs. Without resorting to bypass mode, compressed pattern diagnosis can be classified into two categories: indirect diagnosis and direct diagnosis. Indirect diagnosis performs diagnosis for compactor-based designs through two phases. In the first phase, the scan cells which should observe failures are identified using backward mapping techniques from the compactor outputs collected on ATE. In the second phase, with information about which scan cells observed failures during the first phase, any ATPG-based diagnostic technique that was originally targeted for circuits without compactors can be applied. In general, direct diagnosis techniques do not need backward mapping to identify failing scan cells. Direct diagnosis techniques are the primary focus of this disclosure, though the principles of the disclosed technologies are readily applicable to indirect diagnostic techniques. Aspects of the direct diagnosis techniques discussed herein are described in further detail in U.S. Patent Application Publication Nos. 2005/0222816 and 2006/0111873, both of which are incorporated herein by reference.

Figure 4:
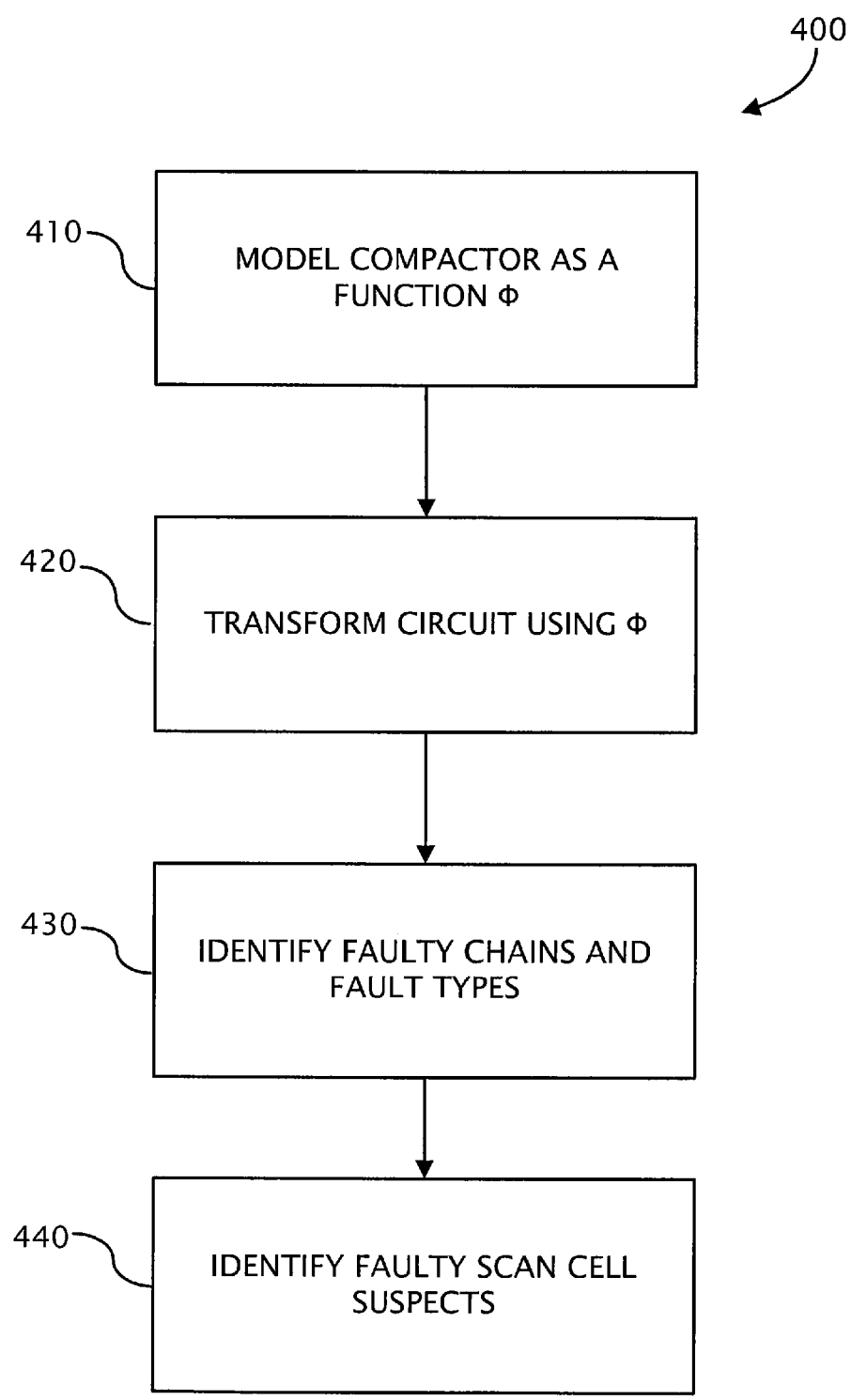
FIG. 4 shows a block diagram of one embodiment of an exemplary method for diagnosing scan chain defects in designs with embedded compression hardware.

FIG. 4 shows a block diagram of one embodiment of an exemplary method 400 for diagnosing defects in scan chains with compressed patterns. In a method act 410, a compactor is modeled as a function $\Phi$ such that $\Phi(R)=r$, where R is the test response before compaction and r is the test response after compaction. In a method act 420, the original circuit can then be transformed, for example, into a circuit with so-called pseudo-scan chains by incorporating compactor function $\Phi$.

In a method act 430, one or more faulty scan chains and fault types are identified. For example, in some embodiments a failure log file for a chain test is read. Masking patterns can be applied during chain testing. As used herein, a masking pattern is a pattern configured so that a selected number of scan chains (e.g., only one scan chain) is observed from one compactor output channel while other scan chains (e.g., all other scan chains) connecting to the same output channel are masked (e.g., using unknown values for all values in a given chain). It is straightforward to identify faulty chain(s) from pseudo-scan chains using one or more masking chain patterns. This can be done using, for example, a technique similar the method act 110 with the pseudo scan chains of the transformed circuit.

In a method act 440, one or more faulty scan cell suspects are identified. For example, in some embodiments, a failure log file for the scan test is read. With compressed scan test patterns, the method acts 120, 130 of the method 100, described above for non-compressed patterns, can be performed for the compressed test patterns by performing fault simulation of the faulty scan chain(s) against the transformed circuit. The compacted simulation results can be compared with the compacted failure data collected from the tester. The best matching scan cell(s) can be reported as suspect(s).

Figure 5:
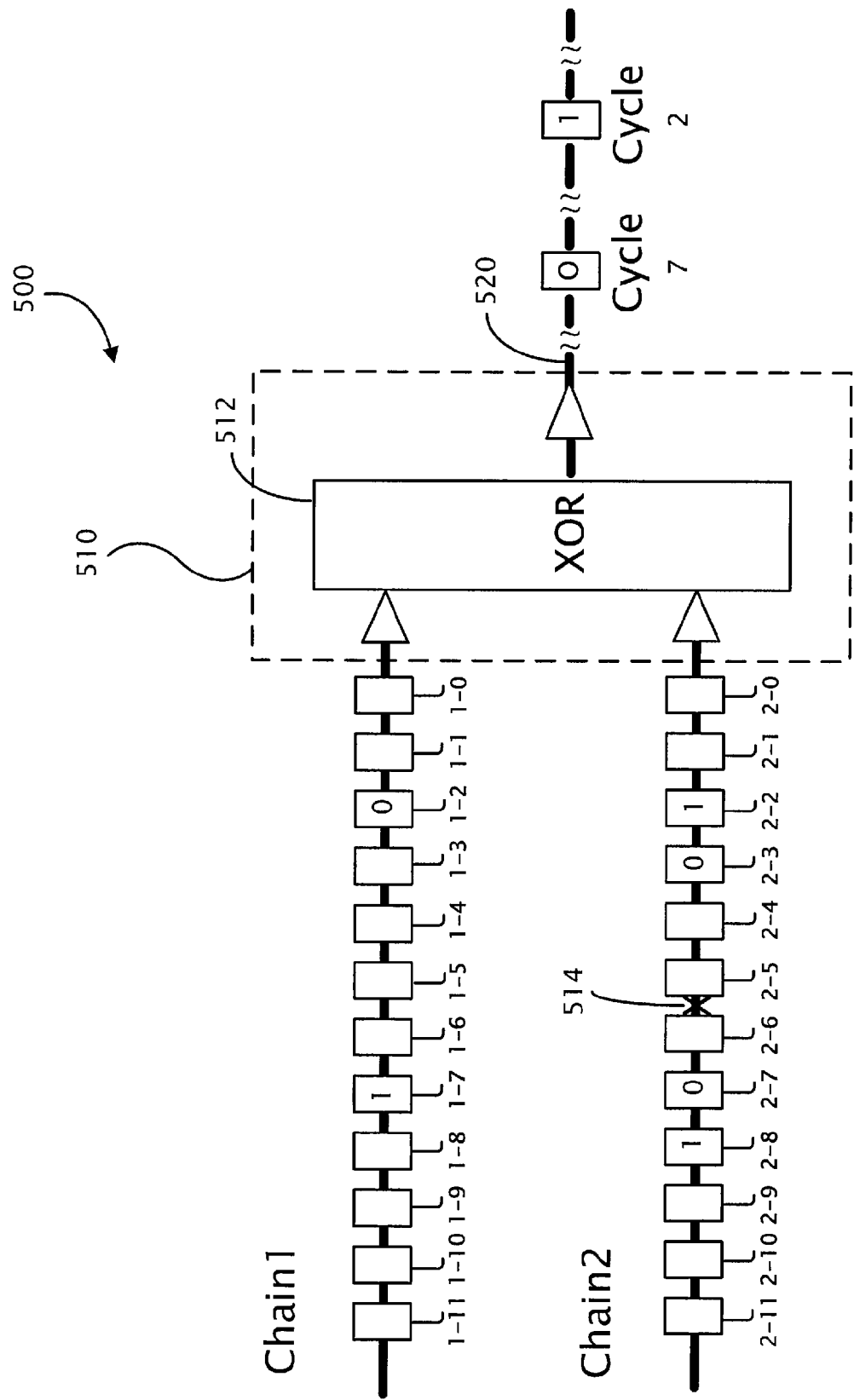
FIG. 5 shows a block diagram of a circuit comprising an embedded deterministic test compactor.

The above-described methodology can be illustrated by considering an exemplary diagnosis of a chain defect. For example, a design with a simple embedded deterministic test (EDT) compactor can be used (such as that described in J. Rajski et al., "Embedded Deterministic Test for Low Cost Manufacturing Test," *Proc. ITC*, pp. 301-310 (2002) (hereinafter "Rajski et al."), which is incorporated herein by reference). FIG. 5 shows a block diagram of such an exemplary circuit 500. In this example, the EDT compactor 510 comprises an XOR gate 512 and is coupled to two internal scan chains (Chain1 and Chain2) coupled to system logic (not shown). Each scan chain has 12 scan cells numbered cell 1-0 to cell 1-11 in Chain1 and cell 2-0 to cell 2-11 in Chain2. In each chain, cell 11 is connected to a respective scan input and cell 0 is connected to a respective scan output. Chain1 is a good chain while Chain2 is a defective chain with a hold time error between cells 2-5 and 2-6, as shown by an "X" 514.

Using the method 400, the circuit 500 is transformed from a circuit with two internal chains and an EDT compactor into a circuit with one scan-out channel (e.g., as in method acts 410, 420). Masking chain patterns are used to determine the faulty chain and fault type (e.g., as in method act 430). In this example, masking chain patterns are used to determine that Chain2 has one hold time fault.

To locate the faulty cell (e.g., as in method act 440), system logic scan test patterns are used. For example, to find the upper bound and lower bound of the faulty cell on Chain2, masking is applied to the faulty chain by changing all loading values on Chain2 to "X" for a pattern. In this example, some known values are captured on cells 1-2, 1-7, 2-2, 2-3, 2-7 and 2-8 as shown in FIG. 5 during the capture phase. Also in this example, at the compactor channel output 520 a passing bit (i.e., a "1") is observed at cycle 2, and a failing bit (i.e., a "0") is observed at cycle 7 (resulting from a "1" in cell 1-7 and a "1" in cell 2-7 being XORed to "1" rather than to the expected "0." Therefore, it is known that due to the captured transition at cell 7 and cell 8 (i.e., different respective values in cells 7 and 8), the captured "0" in cell 7 had been changed to a "1" during unloading when the "0" goes through the hold time fault location 514. Hence, it can be determined that the faulty cell must be somewhere between the output of cell 2-7 and input of cell 2-2 on Chain 2. Accordingly, cell 2-7 is designated as the upper bound of the location of the faulty cell and cell 2-2 the lower bound. After the suspect range on Chain2 is determined, a hold-time fault can be injected at the cells between 2-2 and 2-7 (for example, one at a time) and one or more scan patterns can be simulated. The simulation results can be compared against the observed results from ATE. The best matching cell(s) can be reported as suspect(s).

Figure 6:
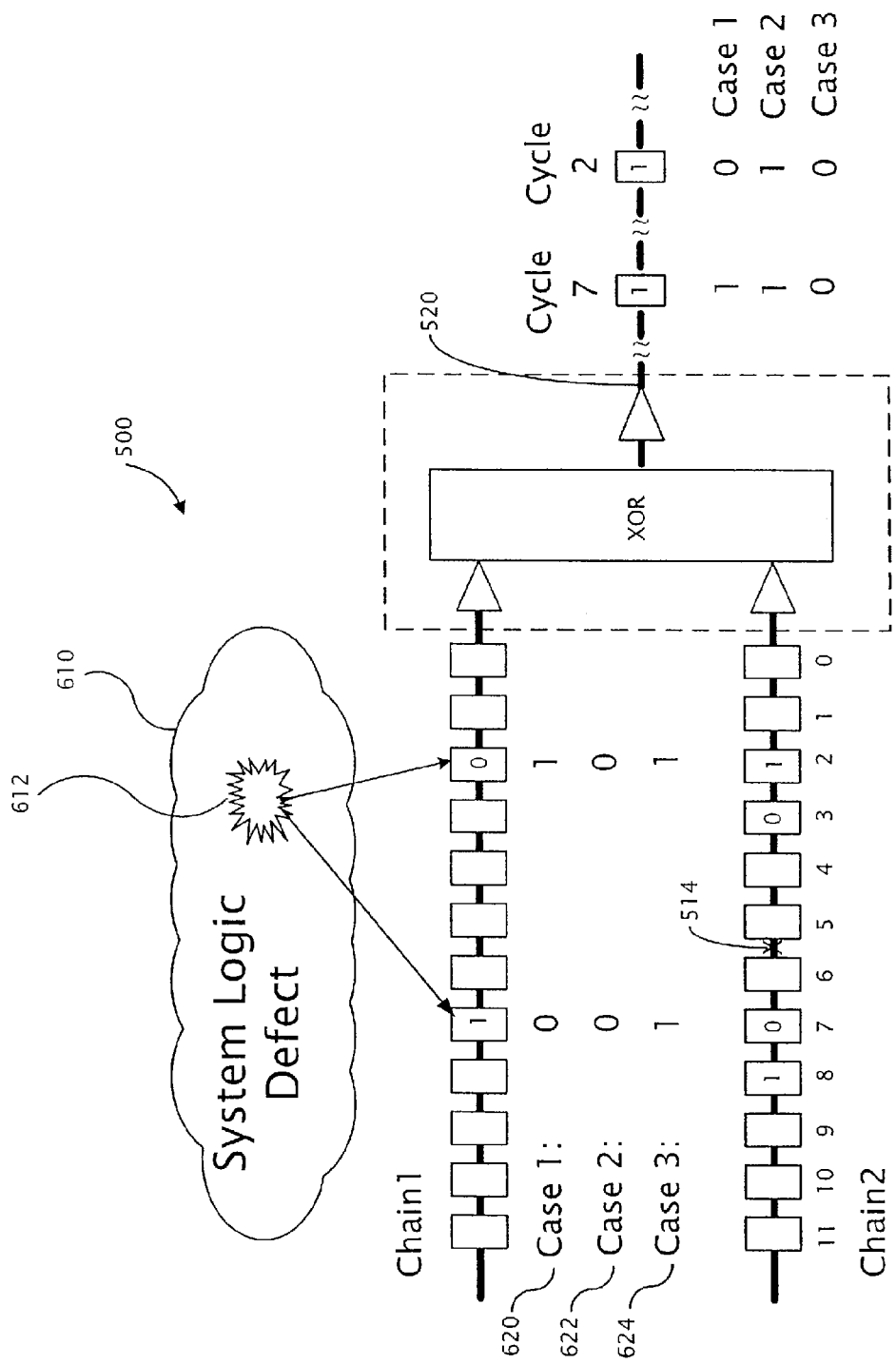
FIG. 6 shows a block diagram of a circuit illustrating the impact of a system logic defect on a compressed pattern scan chain diagnosis method.

Note that when system logic scan patterns are used, it is assumed that the system logic is defect free. If this assumption is not true, the above-described methodology may not work. FIG. 6 illustrates the impact of a system logic defect on the compressed pattern scan chain diagnosis method 400. FIG. 6 shows the circuit 500, as well as system logic 610, which is coupled to Chain1 and which contains a system logic defect 612. In cases where there is a system logic defect on the same die, the compressed pattern chain diagnosis method 400 can provide an incorrect diagnosis, and the system logic defect 612 can have a different impact on chain diagnosis in different situations.

In Case 1, the system logic defect 612 changes the captured values at cell 1-2 and cell 1-7. Cell 7 and cell 2 on Chain1 will unload 0 and 1, respectively (as indicated at 620), and cell 7 and cell 2 on Chain2 will unload 1 and 1, respectively, due to the hold-time error. After compaction, cycle 7 and cycle 2 will be observed as 1 and 0, respectively, at the compactor output 520. That is, a failing bit at cycle 2 and a passing bit at cycle 7 will be observed at the compactor output 520. This would lead to an incorrect conclusion that there is an intermittent hold time fault at a scan cell downstream of cell 2-2 (that is, between cell 2-0 and cell 2-2). The fault is intermittent because it makes only cell 2-2 (but not cell 2-7) fail during unloading.

In Case 2, the system logic defect 612 changes only the captured values at cell 1-7. Cell 7 and cell 2 on Chain1 will unload 0 and 0, respectively (as shown at 622), and cell 7 and cell 2 on Chain2 will unload 1 and 1, respectively, due to the hold-time error. After compaction, cycle 7 and cycle 2 will be observed as 1 and 1, respectively. That is, both cycle 2 and cycle 7 will be observed as passing bits at the compactor output channel. This would lead to an incorrect conclusion that the hold-time fault is in a scan cell upstream of cell 7 on chain2 (that is, between cell 2-8 and cell 2-11, inclusive).

In Case 3, the system logic defect changes only the captured values at cell 2 on Chain1. Cell 7 and cell 2 on Chain1 will unload 1 and 1, respectively (as shown at 624), and cell 7 and cell 2 on Chain2 will unload 1 and 1, respectively, due to the hold-time error. After compaction, cycle 7 and cycle 2 will be observed as 0 and 0. That is, both cycle 2 and cycle 7 will be observed as failing bits at the compactor output channel. This would lead to an incorrect conclusion that the hold-time fault is in a scan cell downstream of cell 2 on Chain2 (that is, between cell 2-0 and cell 2-2, inclusive).

One or more system logic defects can also change the captured values at other cells such as cells 2-2, 2-3, 2-7 and 2-8 or their combinations. In general, the impact of a system logic defect can invalidate the results of compressed pattern scan chain diagnosis in numerous ways.

Exemplary Compound Defect Diagnosis Techniques

Failure Partitioning

Exemplary embodiments of the disclosed technologies identify chain and logic defects by partitioning failing bits (e.g., all failing bits) into two groups: a first group of failing bits (called herein "Group1") determined as being caused by system logic failures, and a second group of failing bits (called herein "Group2") determined as being possibly caused by chain defects, system logic defects, or the compound effects of both.

Given a set of partitioned failing bits, logic diagnosis can be run on failing bits in Group1 while masking one or more faulty chains, and chain diagnosis can be run on failing bits in Group2 while masking one or more system logic defects.

If a set of failing bits cannot be partitioned, in some embodiments, just chain diagnosis is performed. To improve the resolution of a case where the set of failing bits cannot be partitioned, per-pattern based chain diagnosis can be run, as explained in more detail below.

Figure 7:
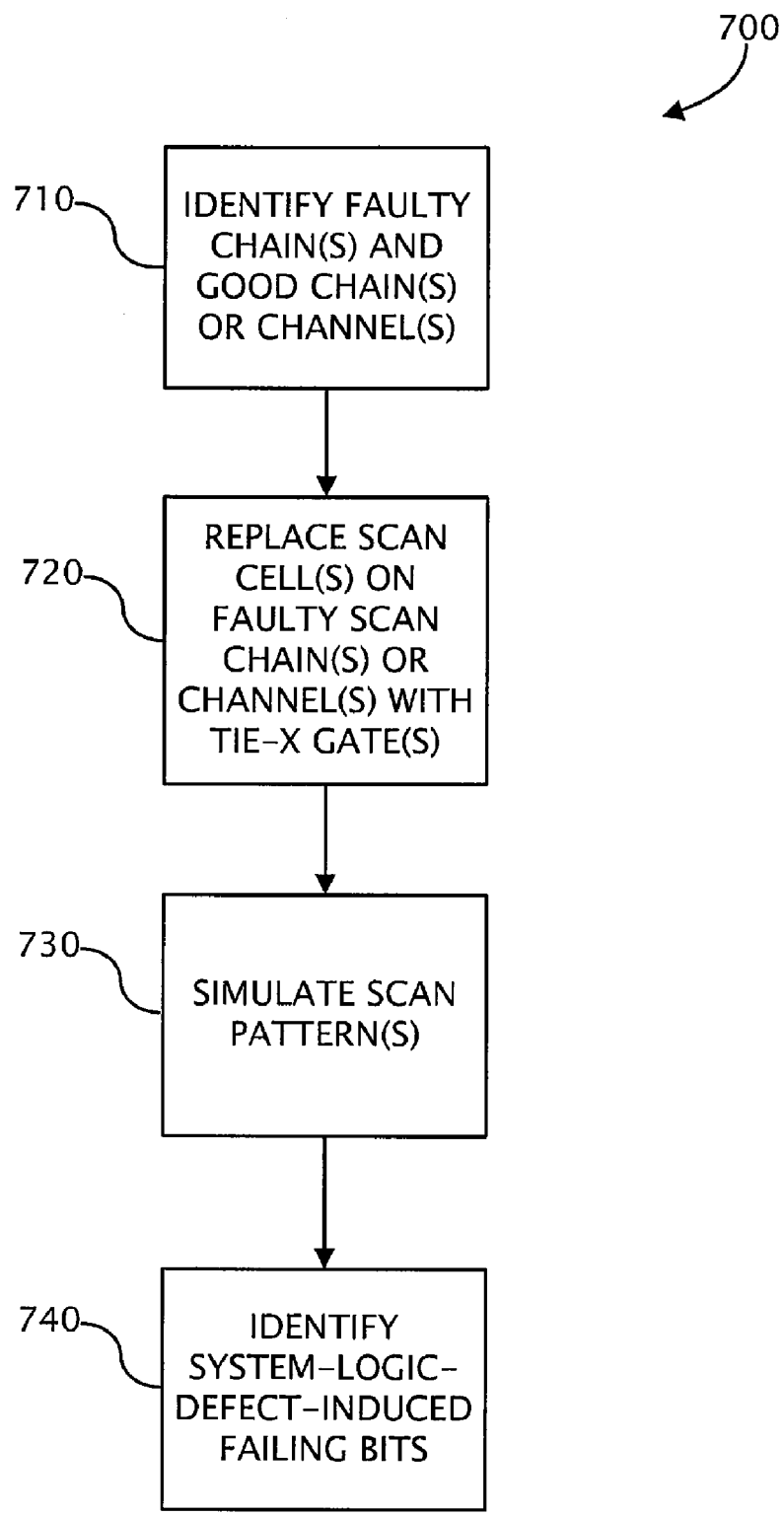
FIG. 7 shows a block diagram of an exemplary method for identifying system-logic-defect-induced failing bits in the presence of mixed defects.

FIG. 7 shows a block diagram of an exemplary method 700 for identifying system-logic-defect-induced failing bits in the presence of mixed defects. The exemplary method 700 can be used to partition the failure bits into Group1 and Group2 as introduced above. In a method act 710, one or more faulty chains and good chains are identified using chain test patterns. For example, if a chain does not fail any of the applied chain patterns, it can be designated as a good chain. Otherwise, it can be designated as a faulty chain. If an embedded compression technique is used, faulty channels and good channels are identified. A faulty channel is connected through the compactor with at least one faulty scan chain. Channels not connected through the compactor with at least one faulty scan chain are considered good channels.

In a method act 720, in a representation of the circuit-under-test design, one or more scan cells (e.g., all scan cells) on one or more of the faulty scan chains (e.g., on all of the faulty scan chains) are changed to "tie-X gates." These gates are sometimes also called "X-mask gates," and the two terms can be used interchangeably. A tie-X gate produces "X" at the output of the gate for each time frame regardless of the input to the gate.

In a method act 730, one or more scan patterns (e.g., all of the scan patterns) are simulated against the modified design representation (e.g., against the modified design netlist) under the assumption that no system logic defects exist.

In a method act 740, it is determined if there are system-logic-defect-induced failing bits. Such bits are placed in Group1, while the remaining failing bits are placed in Group2. In one exemplary embodiment, a failing bit is considered a "system-logic-defect-induced failing bit" if it satisfies the following conditions simultaneously: (A) the failing bit is on either a good scan chain (or a good scan channel, if an embedded compression technique is used) or at a primary output (PO); and (B) the simulation result at this failing bit from the simulation performed in the above method act is not "X".

If condition A is satisfied, the failing bit was not caused during the unloading procedure because it is on a good chain (or channel) or PO. Also, if condition B is satisfied, it can be inferred that the failing bit was not caused by faulty scan chain loaded values because no "X" was propagated to this bit during scan pattern simulation. In other words, if all scan cells of all chains in a group of faulty chains (or faulty channels) are changed to tie-X gates and simulated, the fault simulation indicates that none of the scan cells in the faulty scan chains could cause the failing bit because none of the scan cells have an impact on the value captured at this bit. Therefore, it can be determined that the failing bit is caused by a system logic defect. Thus, it can also be determined that the failing chip has compound defects and the failure partition is successful.

It is possible that the failure partitioning will be unsuccessful for a failing die having compound defects because, in some cases, system-defect-induced failing bits can be masked by scan chain failures. For example, if a system defect produces only failing bits on a chain Chain1, but Chain1 happens to be a faulty chain, the die cannot be identified as one with mixed defects. In another example, assume that a system defect produces some failing bits on a chain Chain2, where Chain2 is a good chain. Incorrect loading values on Chain1 can also make these bits fail on Chain2. In this scenario, the exact cause of the failing bits cannot generally be determined. For cases where the failing bits cannot be partitioned into two groups, there are at least two possibilities: (1) the system logic defects have no impact on at least some selected chain diagnosis results such that chain diagnosis can still produce a correct result; and (2) the system logic defects impact chain diagnosis results such that the results are incorrect. For the second possibility, in some cases chain diagnosis results can be enhanced by using a per-pattern based diagnosis technique, as explained below.

System Logic Diagnosis with Defective Chains

Figure 8:
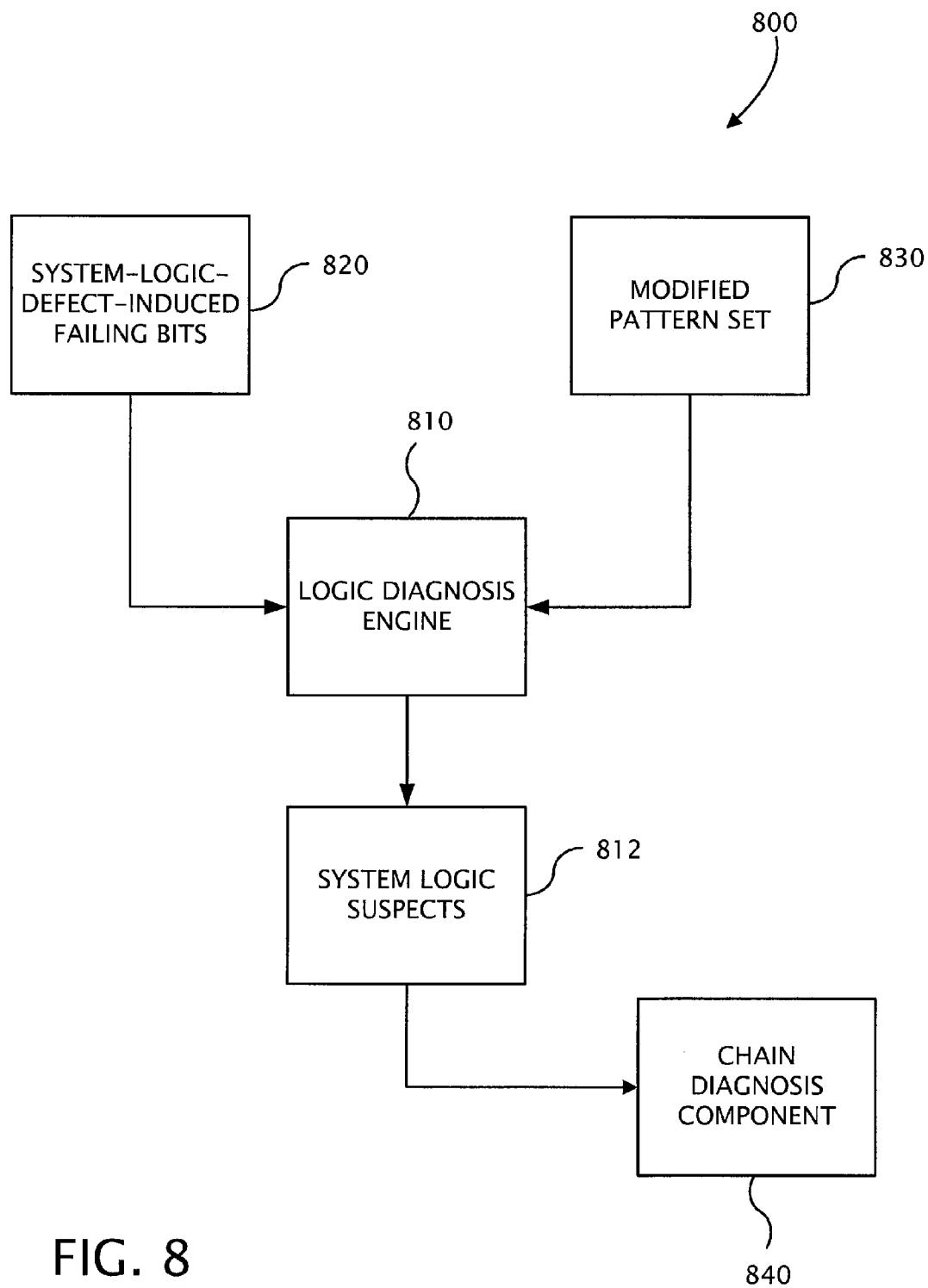
FIG. 8 shows a block diagram of an exemplary system for diagnosing system logic with defective scan chains.

FIG. 8 shows a block diagram of an exemplary system 800 for diagnosing system logic with defective scan chains. The system 800 comprises a logic diagnosis engine 810 which can employ, for example, a conventional logic diagnosis technique to produce a set of system logic suspects 812. Two sets of information are input into the logic diagnosis engine 810: a description of system-logic-defect-induced failing bits 820 (obtained, for example, using the method 700 described above), and a modified test pattern set 830 obtained, for example, by taking a defective scan chain into consideration.

Figure 9:
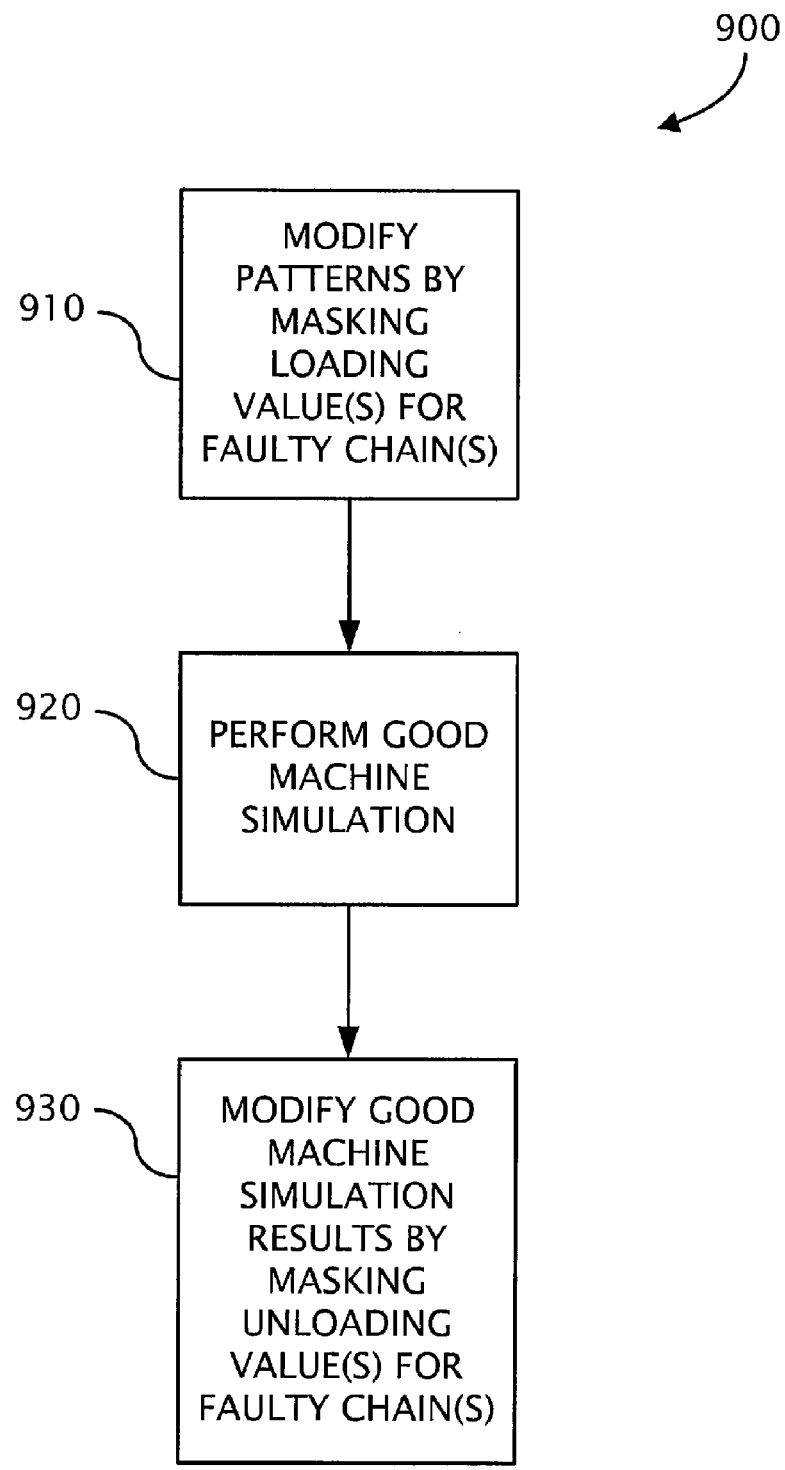
FIG. 9 shows a block diagram of an exemplary method for creating descriptions of modified patterns for use with technologies disclosed herein.

FIG. 9 shows a block diagram of an exemplary method 900 for creating the modified test pattern set 830. To modify the scan patterns, in a method act 910, scan pattern loading values are desirably modified to "X" for one or more faulty chains (e.g., all faulty chains) in the circuit. In a method act 920, a good machine simulation is run with one or more of the modified patterns (e.g., all modified patterns) against a modified representation of the circuit design. In a method act 930, the good machine simulation results are modified so that the unloading values from one or more faulty chains (e.g., all faulty chains) are also modified to "X". Thus, in the resulting modified pattern (comprising the combination of the loading values and unloading values) the loading and unloading values on one or more of the faulty chains are masked to "X." The degree of masking performed in method acts 910 and 930 can vary from embodiment to embodiment. For example, in some embodiments, all loading and unloading values in a faulty chain are masked, resulting in "full masking." In other embodiments, only a portion of the loading and unloading values are masked, resulting in "partial masking." For instance, in one particular implementation, the loading values in scan cells from the output end of the scan chain to the scan defect location are masked and the unloading values in scan cells from the input end of the scan chain to the scan defect location are masked. When logic diagnosis is finished, the X-masked scan cells can be changed back to normal scan cells in the circuit design representation.

In further embodiments the system 800 can be used in conjunction with a chain diagnosis component 840, which can perform chain diagnosis using the set of system logic suspects 812, as described below, for example.

Chain Diagnosis with Defective System Logic

Figure 10:
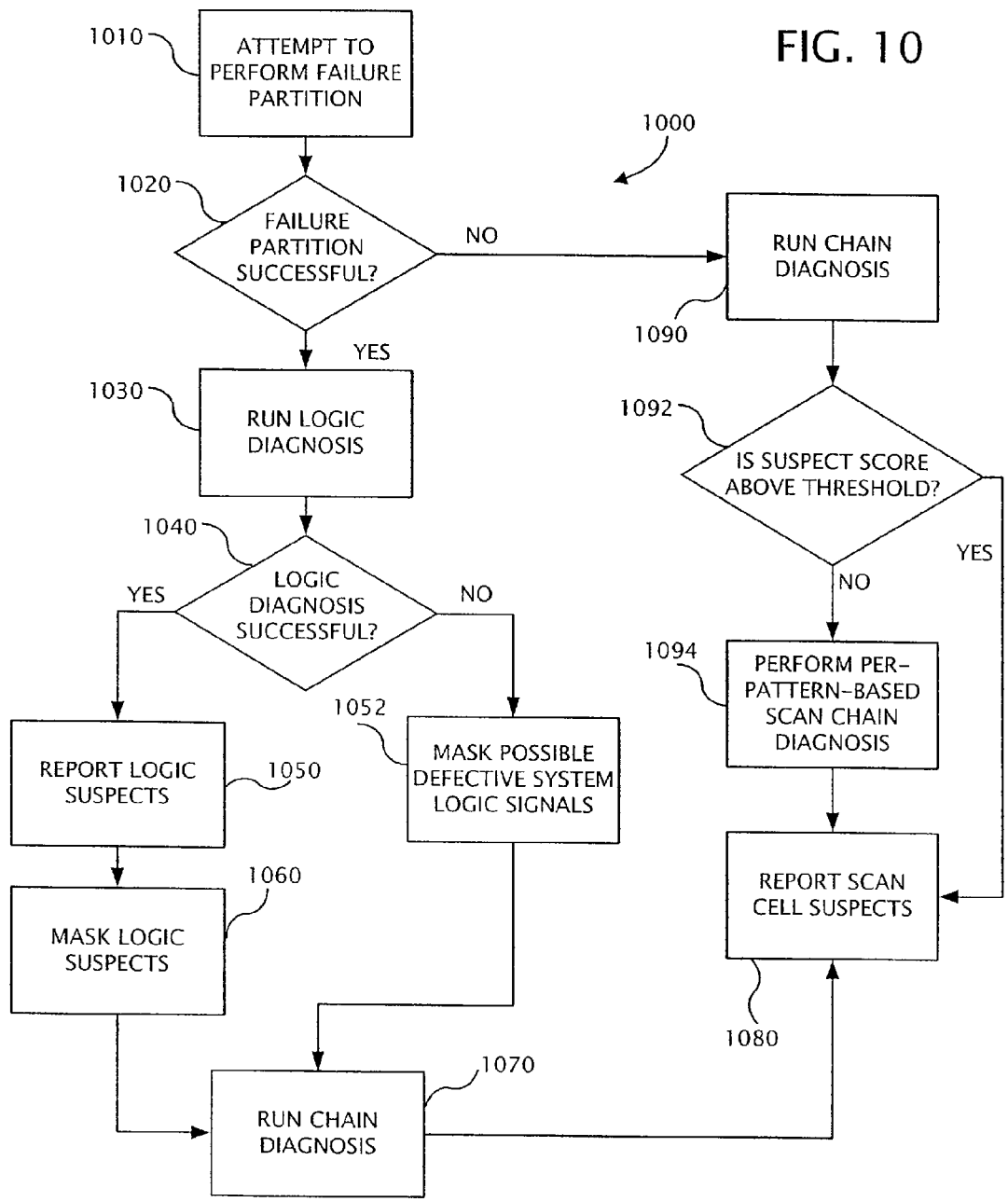
FIG. 10 shows a block diagram of an exemplary method for diagnosing compound defects.

FIG. 10 shows a block diagram of an exemplary method 1000 for diagnosing compound defects. Various aspects of this method are explained in the context of three exemplary scenarios described below.

In a first scenario, failure partitioning is performed in a method act 1010 using, for example, the method 700 described above. If failure partitioning is determined to be successful at method act 1020 (e.g., at least one failing bit was group into Group1), then logic diagnosis is run at a method act 1030 (using, for example, a system such as the system 800) and checked for success at a method act 1040. Here, logic diagnosis is considered "successful" if the logic diagnosis: (1) has located at least one logic suspect (corresponding to a fault candidate in the system logic in which a defect explaining the observed faulty behavior might exist); and (2) at least one suspect has been identified with a desired level of certainty as containing the fault (e.g., with a score of 100, i.e., the suspect can explain all failures in Group1 of the failure partition results). In this scenario, the diagnosis is successful, and one or more logic suspects are reported in method act 1050. In some embodiments, the method act 1050 comprises storing a description of the logic suspects in one or more computer-readable media. At least some (e.g., all) system logic gates in the logic diagnosis suspect report are masked by, for example, changing these gates to X-mask gates in a method act 1060. The chain diagnosis is then run in a method act 1070, in this case on the failures in Group2 (using, for example, the method 100) against the modified design with the masked gates. The scan cell suspects are reported in a method act 1080. In some embodiments, the method act 1080 comprises storing a description of the scan cell suspects in one or more computer-readable media.

In a second scenario, the failure partitioning is successful, but the logic diagnosis is unsuccessful. Here, the logic diagnosis is considered "unsuccessful" if: (1) the logic diagnosis cannot locate at least a given number of logic suspects (e.g., any logic suspects); or (2) no suspect can be identified with a desired level of certainty as containing the fault (e.g., with a score of 100). In this case, the system logic defects potentially contributing to the failing bits in Group1 can be masked at a method act 1052.

Figure 11:
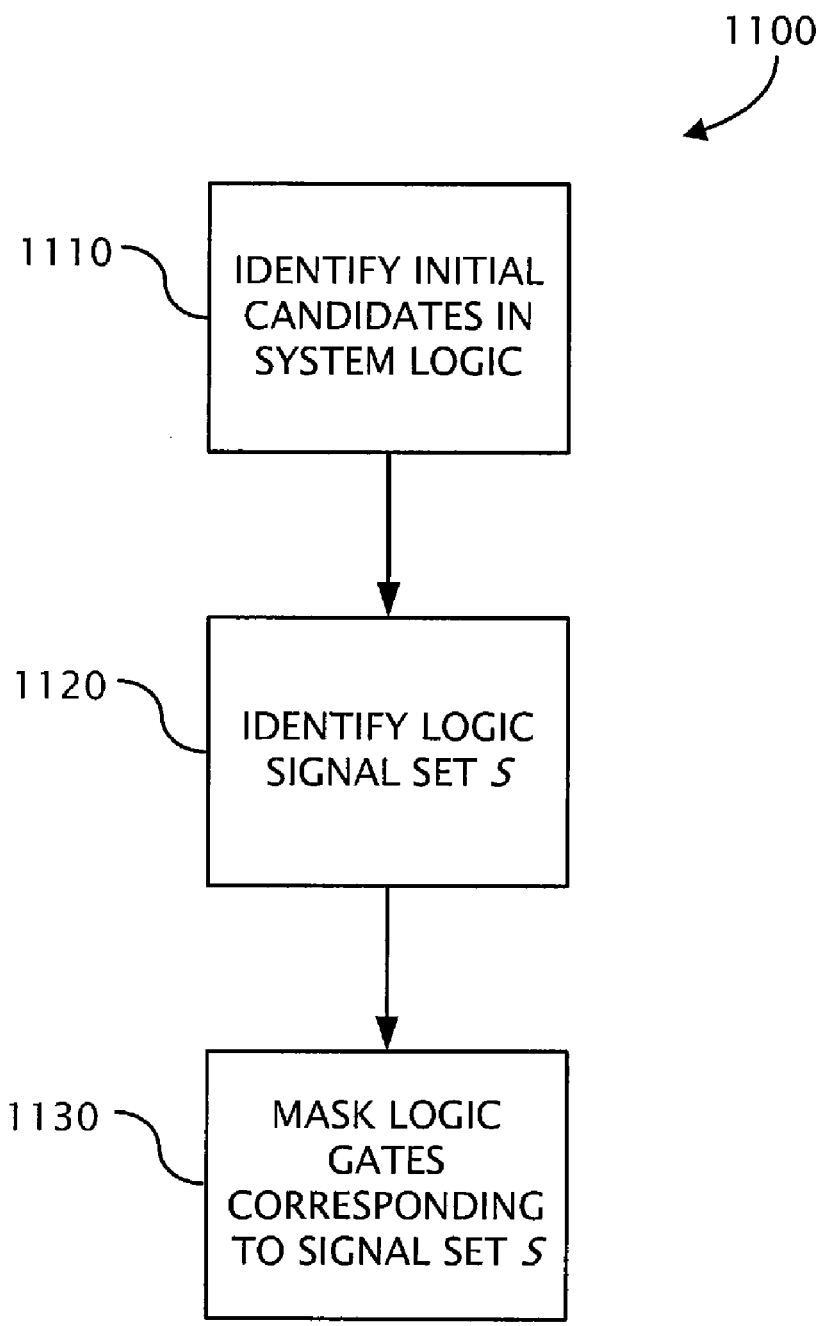
FIG. 11 shows a block diagram of an exemplary method for masking possible defective system logic signals.

FIG. 11 shows a block diagram of one embodiment of an exemplary method 1100 that can be used in the method act 1052. In a method act 1110, initial fault candidates are identified in the system logic. In some embodiments the candidates are identified using a critical path tracing technique (such as the one described in S. B. Akers et al., "Why Is Less Information From Logic Simulation More Useful in Fault Simulation," Proc. Int'l Test Conference, pp. 786-800 (1990)). For example, the candidates can be determined by back tracing from each system-logic-defect-induced failure bit. In a method act 1120, a logic signal set S is determined from the identified candidates. In some embodiments, the logic signal set S can include all potential defective logic signals or the intersection of the potential logic signals for each failure bit k. For example, S can be $\cup_k S_k$ or S can be $\cap_k S_k$. This is discussed in more detail below. In cases where exactly one system-logic-defect-induced failure bit is identified, there is no need to perform a union or intersection operation, and all signals identified by back tracing from the failure bit can be considered possible defective system logic signals. In a method act 1130, one or more system logic gates in set S (e.g., all system logic gates in set S) are masked by changing these gates to tie-X gates in a representation of the circuit design.

Figure 12:
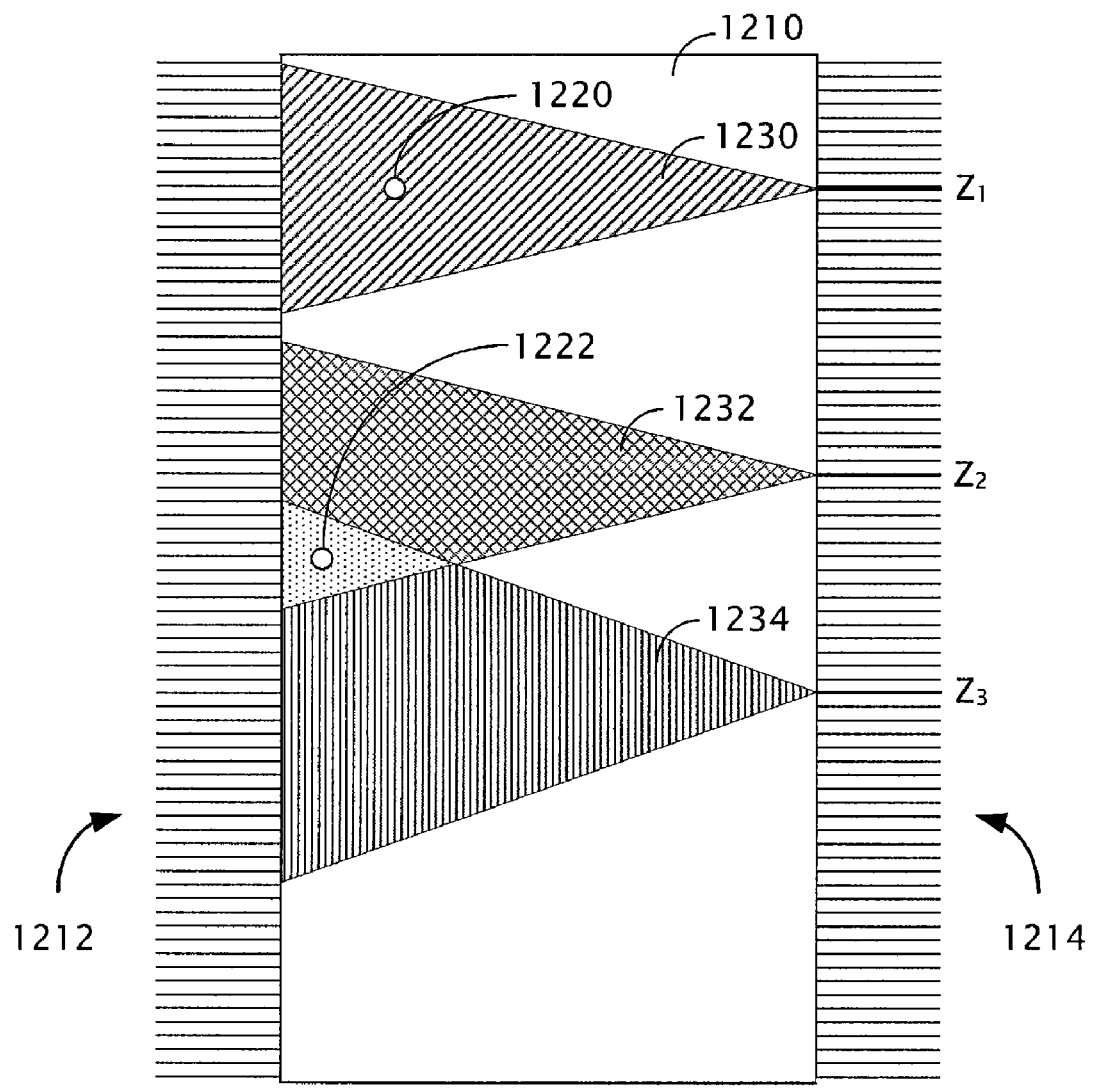
FIG. 12 shows a block diagram of a circuit with system-logic-induced failing bits being analyzed using a union of logic cones.

FIG. 12 shows a block diagram of an exemplary embodiment of system logic 1210 in a circuit. The system logic 1210 comprises primary inputs 1212 and primary outputs 1214. In this example, the system logic 1210 comprises two defects 1220, 1222 which produce failing bits on outputs $Z_1$, $Z_2$ and $Z_3$. The respective logic cones for $Z_1$, $Z_2$ and $Z_3$ are shown at 1230, 1232 and 1234. As seen in FIG. 12, in this case performing a union operation after tracing back from $Z_1$, $Z_2$ and $Z_3$ in Group1 causes the system defects 1220, 1222 to be included in S, even though there are multiple system logic defects. In some embodiments, one potential disadvantage of this method is that it can produce a set S that causes too many system logic gates to be masked, which can result in dropped chain diagnosis resolution.

Figure 13:
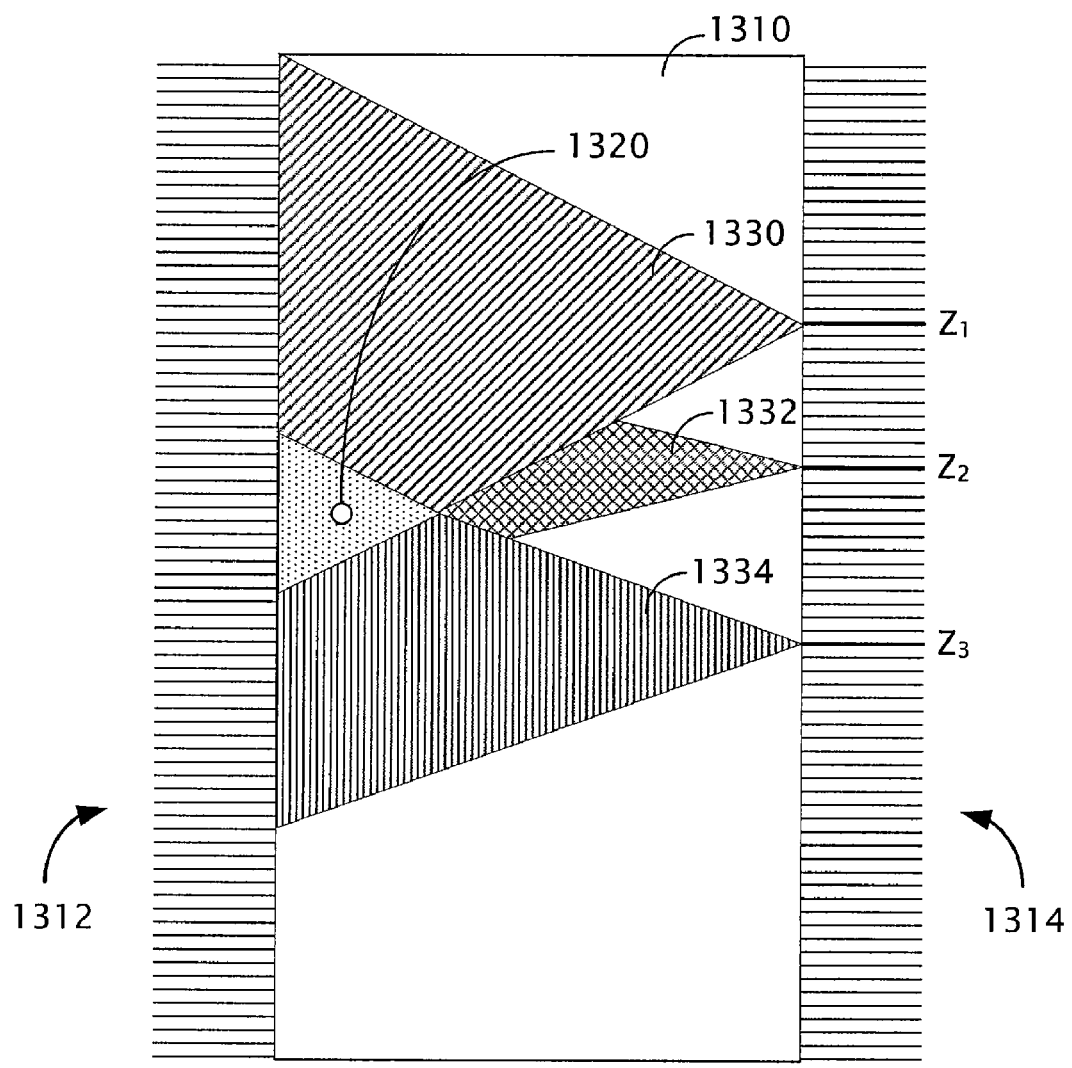
FIG. 13 shows a block diagram of a circuit with system-logic-induced failing bits being analyzed using an intersection of logic cones.

FIG. 13 shows a block diagram of an exemplary embodiment of system logic 1310 in a circuit. The system logic 1310 comprises primary inputs 1312 and primary outputs 1314. In this example, the system logic 1310 comprises defect 1320 which produces failing bits on outputs $Z_1$, $Z_2$ and $Z_3$. The respective logic cones for $Z_1$, $Z_2$ and $Z_3$ are shown at 1330, 1332 and 1334. In this example, performing an intersection operation (e.g., tracing back from failures $Z_1$, $Z_2$ and $Z_3$ in Group1) will help ensure that the real system defects are included in S, if it has single system logic defect. In some embodiments, one possible advantage of this approach is that it can produce a set S that (compared to a set produced with a union operation) has better chain diagnosis resolution because fewer system logic gates are masked.

Because it is typically not known whether a die has single or multiple system logic defects, certain embodiments of the disclosed technologies use both options when identifying the set of logic signals to be masked. For example, one such embodiment uses the union operation first. If the union operation results in unacceptable diagnosis resolution, the intersection operation is used.

Another embodiment uses the intersection operation first. If the intersection produces an empty set, the die is assumed to have multiple system defects and the union operation can be used instead. If the intersection produces a non-empty set, it can be assumed that the die has a single system logic defect at the moment. However, in this case it is still possible that the die has multiple system logic defects. If this is true, scan chain diagnosis will typically not find any chain suspects that can be identified with a desired level of certainty as containing the fault (e.g., with a score of 100). Thus, the union operation can be used. (Some exemplary scoring criteria are explained below.)

Returning to FIG. 10, after system logic defects are masked at the method act 1052, chain diagnosis is run using the masked logic signals at the method act 1070. The scan cell suspects are reported in a method act 1080.

In a third scenario, if the failure partition is unsuccessful, chain diagnosis can be performed under the assumption that the system logic is defect free, as shown at a method act 1090. As noted above, however, it is possible that the system-logic-defect-induced failures are masked by scan chain failures. This masking can occur when the scan cells on faulty chains were changed to tie-X gates. Thus, according to one exemplary embodiment, the tie-X cells are changed back during the chain diagnosis of method act 1090 so that the system logic defects may have an impact on the chain diagnosis results.

In a method act 1092, one or more suspect scores are compared to a selected threshold and used to measure the impact of system logic defects on the diagnosis results. In some embodiments, to calculate a score for a given suspect, a fault is injected at the suspect location and fault simulation is run. If the simulated values match the observed values, the suspect score is designated the highest possible value (e.g., 100). Note that for purposes of this discussion the following notation is used to indicate a comparison of two values: "simulated_value↔observed_value." Furthermore, according to some embodiments, 0↔1 and 1↔0 are considered mismatches, but X↔1 and X↔0 are not considered mismatches. In various embodiments, one or more such comparisons can be used to generate one or more scores on a pattern-by-pattern basis and/or on a bit-by-bit basis. In some embodiments, if a suspect is identified with a given score that satisfies the selected threshold (e.g., 100), the scan cell fault suspects can be reported in the method act 1080. In some exemplary embodiments, if no suspect is identified with a given score that satisfies the selected threshold (e.g., 100), there is at least one system logic defect on the chip. Because the failing bits are not partitioned, a per-pattern-based diagnosis technique can be used in a method act 1094 to improve chain diagnosis.

One exemplary per-pattern-based diagnosis technique that can be used is based on the observation that a system logic defect can generally impact only a subset of scan patterns for a circuit, while a chain defect could impact many or all scan patterns. Therefore, for each failing pattern, an exemplary embodiment of the per-pattern based diagnosis technique uses the scores from the chain diagnosis at 1090 to filter out incorrect scan chain suspects from the chain diagnosis results. For example, in one exemplary embodiment, if a system logic defect impacts a pattern, the scores associated with the scan chain suspect(s) identified by this pattern during chain diagnosis are less than 100. By contrast, if the score of a suspect identified by a pattern is 100, it means that the system logic defect does not impact the respective pattern. Hence, the scores can be used to screen out possible incorrect scan cell suspects caused by the system logic defects. By screening out possible incorrect scan cell suspects, the actual scan cell suspect(s) can be identified.

It should be noted that at least some embodiments of the disclosed technologies (e.g., the method 1000) can use different approaches in running chain diagnosis (e.g., method act 1070 and 1090) and running logic diagnosis (e.g., method act 1030). Three example approaches include: (1) assuming that each diagnosis (i.e., scan chain diagnosis and system logic diagnosis) does not depend on the result of the other diagnosis; (2) running logic diagnosis first and use the logic diagnosis results to enhance chain diagnosis; and (3) running chain diagnosis first and use the chain diagnosis results to enhance logic diagnosis.

Approach (1) can be used if, for example, logic diagnosis is unsuccessful. Approaches (2) or (3) can be used when, for example, logic diagnosis is successful. However, experimental results for at least some embodiments of Approach (3) are not as good as those for Approach (2), due to the number of masked logic gates.

Figure 14:
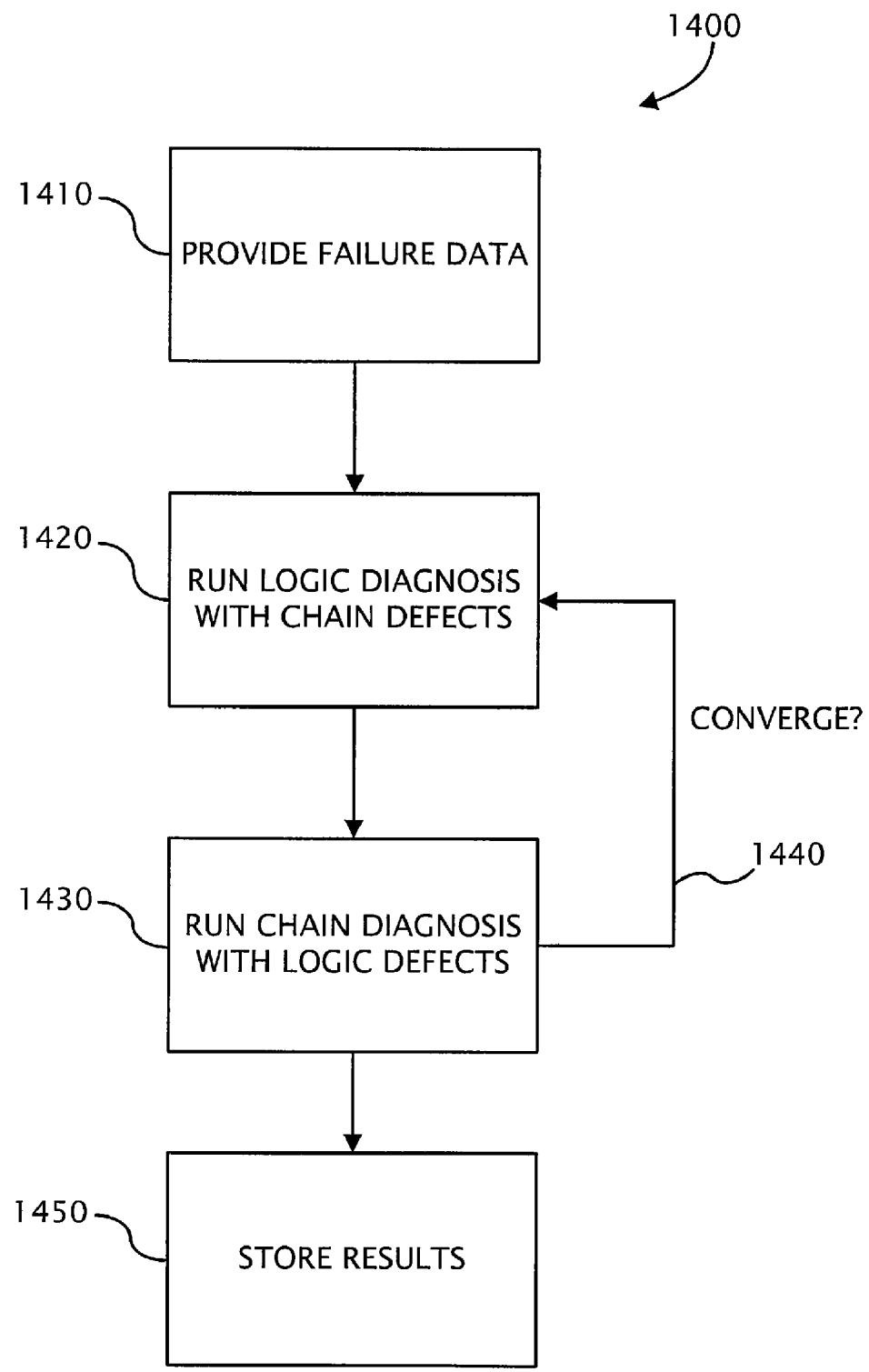
FIG. 14 shows a block diagram of a first exemplary method where an interactive system logic diagnosis and scan chain diagnosis flow is used.

In further embodiments, one or more iterations between Approaches (2) and (3) can be used. FIG. 14 shows a block diagram of an exemplary method 1400 where an interactive system logic diagnosis and scan chain diagnosis flow can be used (e.g., to enhance diagnosis resolution). Failure data is received by a diagnosis system in a method act 1410, and logic diagnosis is run after masking part or all of a faulty chain in the circuit design in a method act 1420. In a method act 1430, chain diagnosis is run after masking the gates in the logic diagnosis report, as described above. If, after chain diagnosis, the defect location of the faulty chain is identified, the loading values for the scan chain (on the scan cells from the fault location down to the scan cell connected with the scan output) are masked, and the unloading values for the scan chain (on the scan cells from the fault location up to the scan cell connected with the scan input) are masked. One or more methods acts can then be repeated, as indicated by the loop 1440. In at least some embodiments, one advantage of this method is that the partial-chain masking may achieve better logic diagnosis resolution than the full-chain masking method. The loop 1440 can be stopped when, for example, a diagnosis resolution enhancement is smaller than a predefined limit (when the results "converge" upon a limit) or when a user defined run time limit is reached. In a method act 1450, diagnosis results can be stored in one or more computer-readable media.

Figure 15:
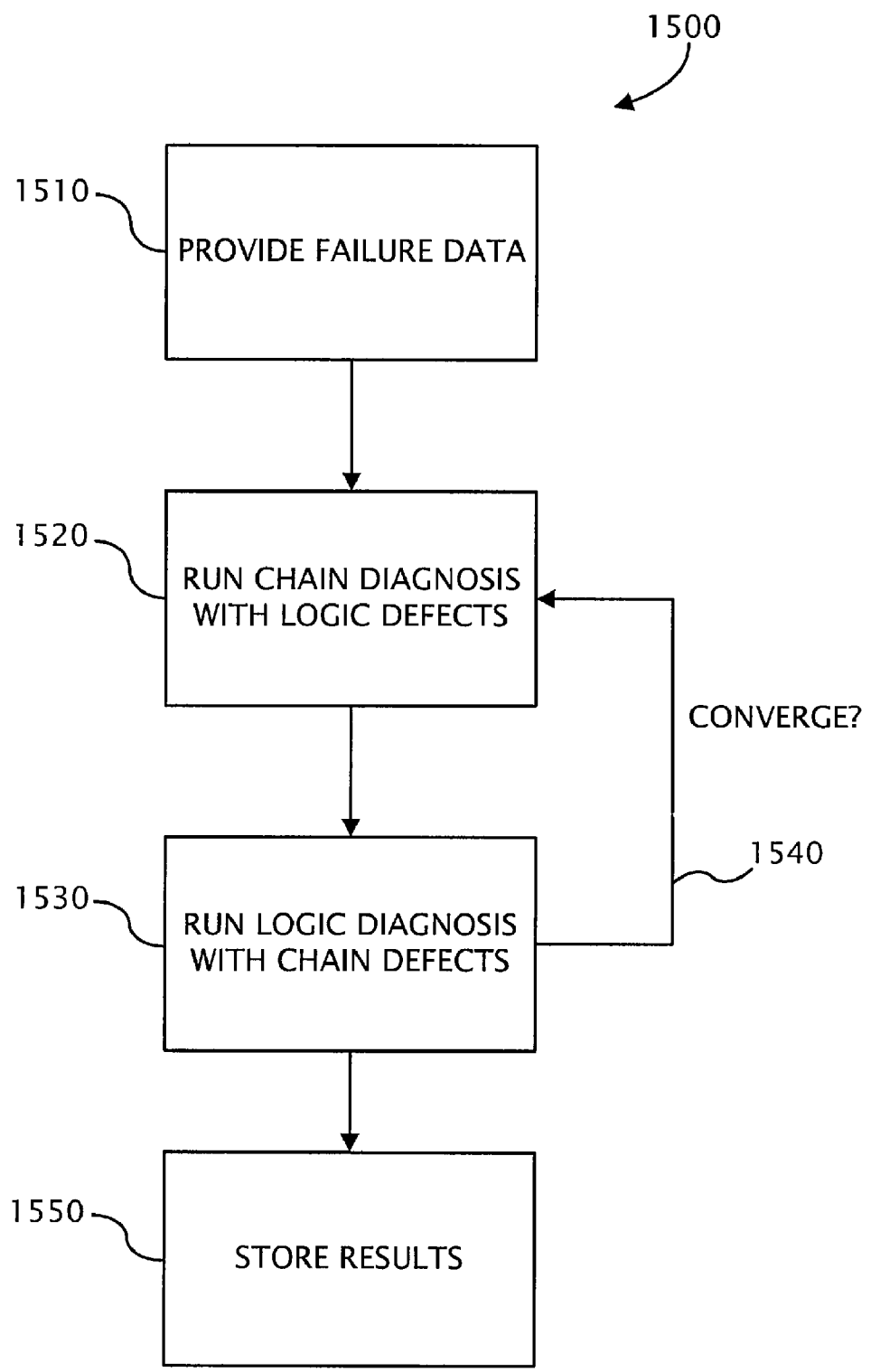
FIG. 15 shows a block diagram of a second exemplary method where an interactive system logic diagnosis and scan chain diagnosis flow is used.

FIG. 15 shows a block diagram of another exemplary method 1500 where an interactive system logic diagnosis and scan chain diagnosis flow can be used (e.g., to enhance diagnosis resolution). Similar to the method 1400, failure data is received by a diagnosis system in a method act 1510. In this embodiment, chain diagnosis is run first in a method act 1520. Then, logic diagnosis is run in a method act 1530 (e.g., with partial-chain masking). As indicated by the loop 1540, one or more method acts can be repeated. For example, the logic diagnosis result can be used to enhance the next round of chain diagnosis results. The loop 1540 can be stopped when, for example, a diagnosis resolution enhancement is smaller than a predefined limit (when the results "converge" upon a limit) or when a user-defined run time limit is reached. In some embodiments, the diagnosis resolution enhancement limit can be based at least in part on the number of suspect scan cells on a faulty chain (for chain diagnosis) and/or the number of suspects per symptom (for logic diagnosis). In a method act 1550, diagnosis results can be stored in one or more computer-readable media.

Experimental Results

Simulated Cases

This section presents experimental results obtained using embodiments of the compound defect diagnosis techniques described above in simulated cases.

In a first simulated case, a non-compressed industrial design ("Design1") was used with 8 scan chains. The scan chain lengths varied from 655 to 725 scan cells. Conventional ATPG was run targeting stuck-at faults to generate one chain pattern and 500 scan patterns. 1000 simulated cases with compound defects were created. For each case, a scan cell was randomly selected and injected with a stuck-at-0 chain fault. Meanwhile, a gate from system logic was randomly selected and injected with a stuck-at-0 fault at its output. After injecting a fault pair for each case, simulations of one chain pattern and 500 scan patterns were run to generate a simulated fail log. Two diagnosis techniques were run on each case, and the diagnosis results were compared. The first chain diagnosis technique (Alg1) was based on an technique similar to one described in R. Guo and S. Venkataraman, "A Technique for Fault Diagnosis of Defects in Scan Chains," Proc. Int'l Test Conference, 2001, pp. 268-277, where the system logic is assumed to be defect-free. The second technique (Alg2) was an embodiment of the exemplary technique shown in FIG. 10 using full-chain masking.

If the reported suspects included the injected fault site, it was called a "hit." The metrics Chain_Diag_Hit_Rate and Logic_Diag_Hit_Rate were defined as follows:

$$\text{Chain\_Diag\_Hit\_Rate} = \frac{\text{\# of Chain diagnosis hits}}{\text{\# of total cases}} \quad (1)$$

$$\text{Logic\_Diag\_Hit\_Rate} = \frac{\text{\# of Logic diagnosis hits}}{\text{\# of total cases}} \quad (2)$$

A second non-compressed industrial design ("Design2") was also used. Design2 comprised 64 scan chains with lengths up to 3184 scan cells. For Design2, conventional ATPG was run targeting stuck-at faults to generate one chain pattern and 100 scan patterns. 1000 simulated cases with compound defects were created. For each case, a scan cell was randomly selected and injected with a stuck-at-0 chain fault. Meanwhile, a gate from system logic was randomly selected and injected with a stuck-at-0 fault at its output. Diagnosis techniques Alg1 and Alg2 were run on each case.

Comparing the results of Alg1 to Alg2, for Design1 the Chain_Diag_Hit_Rate as defined in Eq. 1 increased from 37.1% to 90.4%, and the Logic_Diag_Hit_Rate as defined in Eq. 2 increased from 0 to 58.4%. (See Table 1.) That is, using Alg2, in about 58% of the cases both chain and system logic defects could be successfully diagnosed, while in about 32% of the cases chain defects could be successfully diagnosed, but suspects for the logic defects could not be determined. In less than about 10% of the cases, either no suspects were identified, or misdiagnosed results were produced. Table 1 also shows results for Alg1 and Alg2 with respect to Design2.

TABLE 1

Diagnosis Hit Rate for a Non-Compressed Design

| | Design1 | | Design2 | |
| --- | --- | --- | --- | --- |
| | Alg1 | Alg1 | Alg1 | Alg2 |
| Chain_Diag_Hit_Rate | 37.1% | 90.4% | 31.2% | 98.1% |
| Logic_Diag_Hit_Rate | 0 | 58.4% | 0 | 72.2% |

The unsuccessful diagnosis of logic defects was because of unsuccessful failure partitioning. That is, in about 42% of cases when the entire faulty chain was masked to X-mask gates, all failing bits induced by the logic defects received "X." Therefore the failure partitioning technique described above could be performed on only about 58% of these specific cases. The failure partitioning success rate here was determined by the circuit, scan chain architecture, and patterns. Since the circuit used had only 8 scan chains, masking one chain may have masked out a large number of logic cones. It is expected that when the number of scan chains is increased, the masking effects induced by one chain will be reduced.

The unsuccessful diagnosis of chain defects was a result of the fact that partitioning was unsuccessful. In particular, some failing bits caused by a logic defect misled the chain diagnosis into determining that the faulty chain had multiple or intermittent chain faults. If the diagnosis technique happened to find a perfect match with an incorrect chain fault model, the technique would not run per-pattern based diagnosis. In some embodiments, to enhance the diagnosis hit rate, chain diagnosis can be forced to run per-pattern based diagnosis even if it finds a suspect with a desired score (e.g., a score of 100).

As explained above, when failure partitioning is unsuccessful, diagnosing logic defects can be difficult. However, it can still be possible to perform chain diagnosis. The following further analyzes cases where logic defects are masked, but chain diagnosis is successful. These cases can be classified into two groups. In the first group (denoted G1), the injected logic defect has no impact on chain diagnosis. An example of such a case is shown in Case 1 of FIG. 3. In the second group (denoted G2), the injected logic defects do have impacts on chain diagnosis. However, with the exemplary per-pattern based diagnosis technique described above, this impact can be filtered out while still providing correct chain diagnosis results.

Table 2 shows results for 320 cases in Design1 where failure bit partitioning failed, but where chain defects were correctly diagnosed. For almost 95% of these cases the logic induced defects had no impact on chain diagnosis. For about 5% of the cases per-pattern based diagnosis was needed to screen out the impact of system logic. This is because the number of failing bits caused by chain failure defects is much larger than the number of failing bits caused by system logic defects such that in most cases system-logic-induced-failures are masked by scan chain failures when failure bit partitioning failed. Although per-pattern based diagnosis was only applied in a small number of cases, it was effective in correctly diagnosing those difficult cases where failure bit partitioning was impossible, but system logic defects disturbed the conventional chain diagnosis flow.

TABLE 2

Separated G1 and G2 for Design1

| # of cases with unsuccessful logic diagnosis, but successful chain diagnosis | G1 (logic defect has no impact) | G2 (per-pattern based chain diagnosis) |
| --- | --- | --- |
| 320 | 94.7% | 5.3% |

In another case, an industrial design with EDT technology described in Rajski et al. was used. The design ("Design3") had 128 internal scan chains and 8 external compactor channels, so the compaction ratio was 16×. The internal scan chain lengths varied from 458 to 508. Conventional ATPG was run targeting stuck-at faults to generate 34 chain patterns and 32 scan patterns. 1000 simulated cases with compound defects were created. For each case, an internal scan chain and a scan cell were randomly selected to inject a stuck-at-0 chain fault. Meanwhile, a gate from the system logic was randomly selected, and a stuck-at-0 fault was injected at the output of this gate. After injecting a fault pair for each case, a simulation of all chain patterns and the first 32 scan patterns was run to generate a simulated fail log. Two diagnosis techniques (Alg1 and Alg2) were run on each case, and the diagnosis results were compared. Chain_Diag_Hit_Rate and Logic_Diag_Hit_Rate were measured as defined above in Eqs. 1 and 2, respectively.

As indicated in Table 3, using Alg2 the Chain_Diag_Hit_Rate increased from 33.6% to 85.9%, and the Logic_Diag_Hit_Rate increased from 0 to 56.8% (relative to the results using Alg1). That is, for about 57% of the cases, both chain and system logic defects were diagnosed, while for about 29% cases, chain defects were successfully diagnosed, but no suspects for logic defects were identified. In about 14% of the cases, no suspects were identified, or misdiagnosed results were produced.

TABLE 3

Diagnosis Hit Rate for an EDT Design ("Design3")

| | Design3 | |
| --- | --- | --- |
| | Alg1 | Alg2 |
| Chain_Diag_Hit_Rate | 33.6% | 85.9% |
| Logic_Diag_Hit_Rate | 0 | 56.8% |

At least some reasons for unsuccessful diagnosis of the non-compressed designs analyzed earlier are also applicable to compressed designs. For example, masking one internal scan chain will mask all scan chains that use the same compactor channel. This lowers the success rate of failure partitioning. However, even with the impact of embedded compactors, it can be seen that the diagnosis hit rate increases by using one or more technologies described herein.

Table 4 breaks down the chain diagnosis hits rates shown in Tables 1 and 3 (obtained using Alg2) according to four scenarios. In Scenario I, both failure partitioning and logic diagnosis were successful. In Scenario II, failure partitioning was successful, but logic diagnosis produced no fault suspects. In Scenario III, failure partitioning was unsuccessful, but any logic defects have no affect on chain diagnosis, such that chain diagnosis results are still correct. In Scenario IV, failure partitioning is unsuccessful, and one or more logic defects make chain diagnosis unreliable; in such cases, per-pattern-based chain diagnosis is used.

TABLE 4

Breakdown of Chain Diagnosis Hit Rates

| | Design1 | Design2 | Design3 |
| --- | --- | --- | --- |
| Scenario I | 58.4% | 72.2% | 56.8% |
| Scenario II | 4.1% | 0.3% | 2.5% |
| Scenario III | 26.2% | 23.4% | 23% |
| Scenario IV | 1.7% | 2.2% | 3.6% |

As seen in Table 4, for each design the largest percentage of chain diagnosis hits occurred in Scenario I, with the second-largest percentage of chain diagnosis hits occurring in Scenario III. Although per-patter-based diagnosis was applied in only a small number of cases (Scenario IV), it was effective for diagnosing cases where failure partitioning was not possible, but where system logic defects disturbed the chain diagnosis flow.

Tables 5 and 6 show the chain and logic diagnosis resolutions, respectively, obtained using the disclosed technologies. In these tables, "resolution" is defined as the number of suspect cells per faulty chain (for chain diagnosis) or the number of suspect signals per symptom (for logic diagnosis). Table 5 compares chain diagnosis resolution for cases with and without logic defects. Table 6 compares logic diagnosis resolution for cases with and without chain defects.

TABLE 5

Chain Diagnosis Resolution

| | Design1 | Design2 | Design3 |
| --- | --- | --- | --- |
| | With Logic Defects | | |
| Resolution = 1 | 25.9% | 36.8% | 38.5% |
| Resolution = 2 | 29.5% | 20.2% | 26.1% |
| Resolution = 3 | 8.9% | 9.2% | 7.5% |
| Avg. Resolution | 12 | 8 | 6 |
| | Without Logic Defects | | |
| Resolution = 1 | 31.9% | 42.2% | 48.1% |
| Resolution = 2 | 32.6% | 21.4% | 23% |
| Resolution = 3 | 9% | 11.6% | 0.48% |
| Avg. Resolution | 7 | 5 | 4 |

TABLE 6

Logic Diagnosis Resolution

| | Design1 | Design2 | Design3 |
| --- | --- | --- | --- |
| | With Chain Defects | | |
| Resolution ≦ 3 | 13.9% | 6.8% | 5.3% |
| 4 ≦ Resolution ≦ 6 | 36.6% | 15.3% | 3.6% |
| 7 ≦ Resolution ≦ 9 | 15.6% | 13% | 2.2% |
| Avg. Resolution | 11 | 17 | 27 |
| | Without Chain Defects | | |
| Resolution ≦ 3 | 18.5% | 13.2% | 6.7% |
| 4 ≦ Resolution ≦ 6 | 38.6% | 23.7% | 6.6% |
| 7 ≦ Resolution ≦ 9 | 16.7% | 24.4% | 4.3% |
| Avg. Resolution | 6 | 9 | 20 |

Exemplary Network Environments

Figure 16:
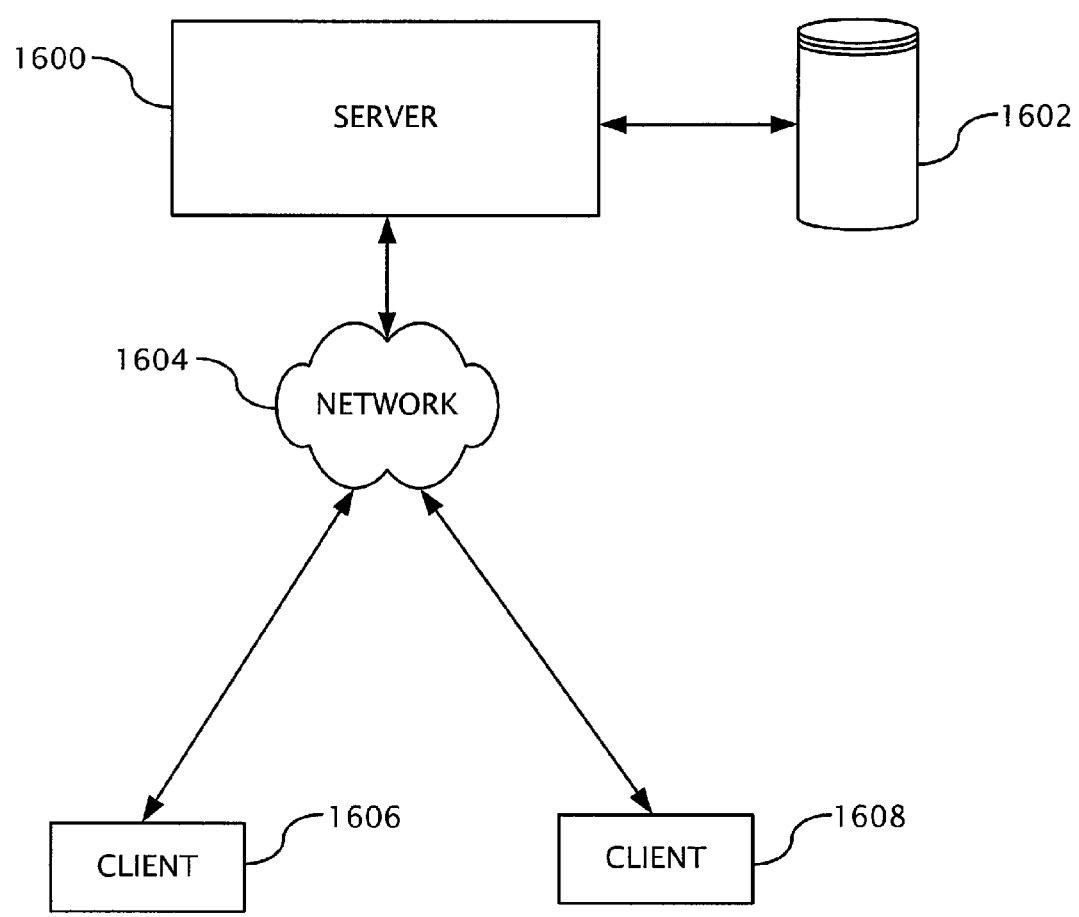
FIG. 16 shows a block diagram of a network as can be used to perform any of the disclosed methods.

Any of the aspects of the technology described above may be performed using a distributed computer network. FIG. 16 shows one suitable exemplary network. A server computer 1600 can have an associated storage device 1602 (internal or external to the server computer). For example, the server computer 1600 can be configured to perform any of the disclosed method embodiments for a given circuit-under-test (for example, as part of an EDA software tool). The server computer 1600 can be coupled to a network, shown generally at 1604, which can comprise, for example, a wide-area network, a local-area network, a client-server network, the Internet, or other suitable network. One or more client computers, such as those shown at 1606, 1608, can be coupled to the network 1604 using a network protocol. The work can also be performed on a single, dedicated workstation, which has its own memory and one or more CPUs.

Figure 17:
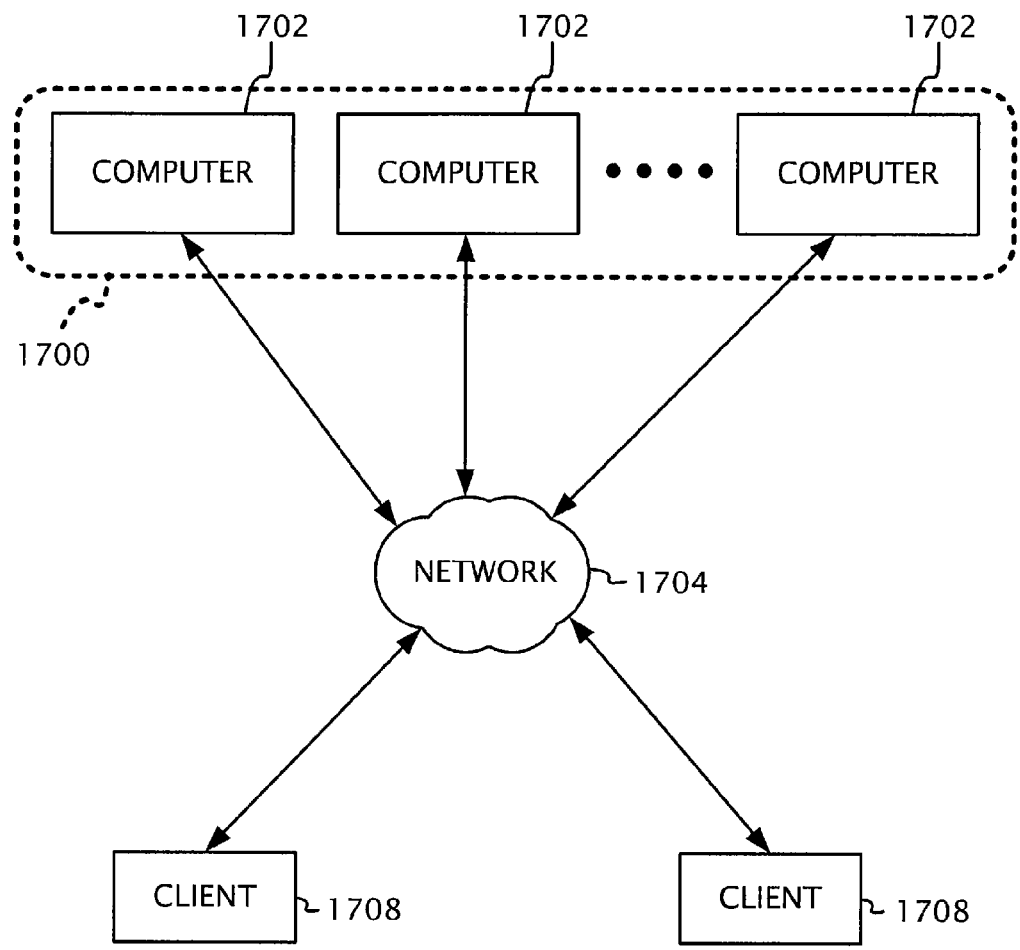
FIG. 17 shows a block diagram of a distributed computing network as can be used to perform any of the disclosed methods.

FIG. 17 shows another exemplary network. One or more computers 1702 communicate via a network 1704 and form a computing environment 1700 (for example, a distributed computing environment). Each of the computers 1702 in the computing environment 1600 can be used to perform at least a portion of method embodiment disclosed herein. The network 1704 in the illustrated embodiment is also coupled to one or more client computers 1708.

Figure 18:
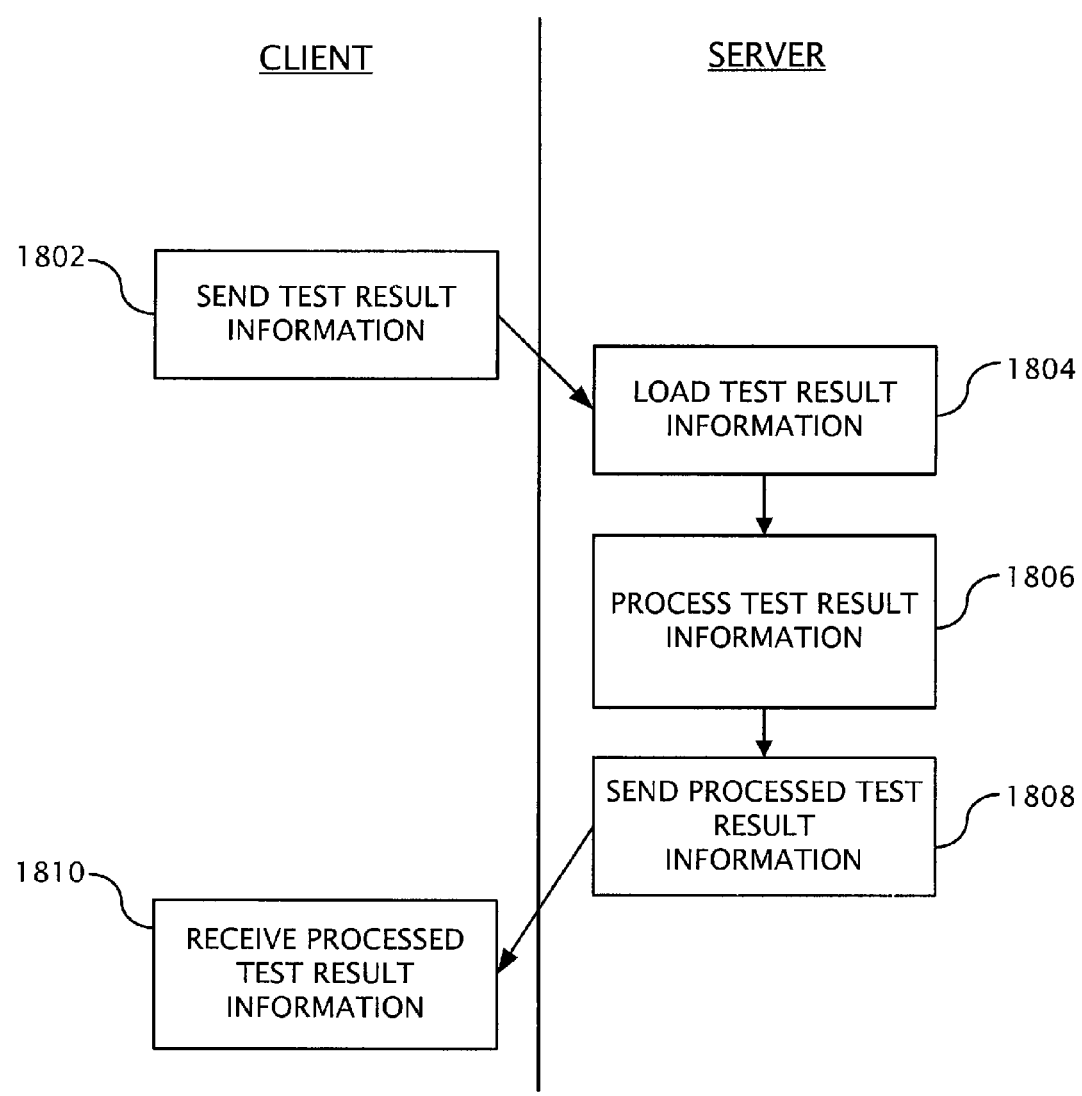
FIG. 18 is a flowchart illustrating how an embodiment of the disclosed method can be performed using the network of FIG. 16 or FIG. 17.

FIG. 18 shows that diagnosis information for a circuit-under-test can be analyzed using a remote server computer (such as the server computer 1600 shown in FIG. 16) or a remote computing environment (such as the computing environment 1700 shown in FIG. 17) in order to diagnose compound defects according to one or more embodiments of the disclosed technologies. At method act 1802, for example, the client computer sends test result information (e.g., failing bits to be partitioned, information related to logic diagnosis, information related to chain diagnosis) to the remote server or computing environment. In method act 1804, the test result information is received and loaded by the remote server or by respective components of the remote computing environment. In method act 1806, the test result information is processed according to one or more of the disclosed embodiments. At method act 1808, the remote server or computing environment sends the resulting processed test result information (e.g., partitioned failing bits, logic diagnosis results, chain diagnosis results, scan cell suspects) to the client computer, which receives the information at method act 1810.

It should be apparent to those skilled in the art that the example shown in FIG. 17 is not the only way to perform the disclosed methods using multiple computers. For instance, the test results information may be stored on a computer-readable medium that is not on a network and that is sent separately to the server or computing environment (for example, a CD-ROM, DVD, or portable hard drive). Or, the server computer or remote computing environment may perform only a portion of the method.

Having illustrated and described the principles of the disclosed technology, it will be apparent to those skilled in the art that the disclosed embodiments can be modified in arrangement and detail without departing from such principles. In view of the many possible embodiments, it will be recognized that the illustrated embodiments include only examples and should not be taken as a limitation on the scope of the invention. Rather, the invention is defined by the following claims and their equivalents. We therefore claim as the invention all such embodiments and equivalents that come within the scope of these claims.

We claim:

1. A method, comprising:
    receiving a failure log indicative of failing test bits observed during testing of an electronic circuit, the electronic circuit having at least one defect in system logic and at least one defect in at least one scan chain;
    identifying one or more fault suspects in the system logic of the electronic circuit;
    identifying one or more fault suspects in the at least one scan chain of the electronic circuit; and
    storing a description of the identified one or more fault suspects in the system logic and of the identified one or more fault suspects in the at least one scan chain in one or more computer-readable media.

2. The method of claim 1, wherein at least one of the one or more fault suspects in the system logic obscures the detectability of at least one of the fault suspects in the at least one scan chain, or wherein at least one of the fault suspects in the at least one scan chain obscures the detectability of at least one of the fault suspects in the system logic.

3. The method of claim 1, wherein the one or more fault suspects in the system logic are identified before the one or more fault suspects in the at least one scan chain are identified.

4. The method of claim 1, wherein the one or more fault suspects in the at least one scan chain are identified before the one or more fault suspects in the system logic are identified.

5. The method of claim 1, further comprising at least one of:
    identifying one or more additional fault suspects in the system logic using the identified one or more fault suspects in the at least one scan chain; and
    identifying one or more additional fault suspects in the at least one scan chain using the identified one or more fault suspects in the system logic.

6. The method of claim 1, wherein the identifying one or more fault suspects in the at least one scan chain comprises:
    masking one or more potential system logic defect signals in a representation of the electronic circuit; and
    using a scan chain defect diagnosis technique to identify the one or more fault suspects in the at least one scan chain.

7. The method of claim 6, wherein the masking the one or more potential system logic defect signals in the representation of the electronic circuit comprises:
    identifying a set of one or more logic signals associated with the identified one or more fault suspects in the system logic; and
    masking one or more logic gates in the electronic circuit corresponding to the identified set of one or more logic signals.

8. The method of claim 7, wherein the identifying the set of one or more logic signals associated with the identified one or more fault suspects in the system logic comprises identifying logic signals in one or more logic cones associated with one or more failing outputs of the system logic.

9. The method of claim 8, further comprising performing at least one of a union operation or an intersection operation between the identified logic signals of at least two of the logic cones.

10. The method of claim 6, wherein the masking the one or more potential system logic defect signals in the representation of the electronic circuit comprises changing one or more logic gates associated with the one or more potential system logic defects into X-mask gates.

11. The method of claim 1, wherein the identifying one or more fault suspects in the system logic comprises:
    receiving a description of failing bits identified as being caused by system logic defects and not by scan chain defects;
    receiving modified scan patterns, the modified scan patterns comprising scan patterns used during the testing of the electronic circuit modified to mask loading and unloading values on faulty scan chains; and
    performing logic diagnosis using the description of the failing bits and the modified scan patterns.

12. The method of claim 11, further comprising:
    modifying the scan patterns used during the testing of the electronic circuit so that loading values in scan chains comprising the fault suspects in the at least one scan chain are masked;
    performing a good machine simulation of the electronic circuit using the modified scan patterns;
    modifying good machine simulation results so that the unloading values in the scan chains comprising the fault suspects in the at least one scan chain are masked; and
    storing the modified loading and unloading values in one or more computer-readable media.

13. The method of claim 11, wherein the modified scan patterns are compressed scan patterns.

14. The method of claim 1, wherein the electronic circuit comprises a compactor outputting to one or more channels, and wherein the at least one scan chain is coupled to a faulty channel via the compactor.

15. One or more computer-readable media storing the description of the identified one or more fault suspects in the system logic and of the identified one or more fault suspects in the at least one scan chain generated by the method of claim 1.

16. One or more computer-readable media storing instructions configured to cause a computer to perform a method, the method comprising:
receiving a failure log indicative of failing test bits observed during testing of an electronic circuit, the electronic circuit having at least one defect in system logic and at least one defect in at least one scan chain;
identifying one or more fault suspects in the system logic of the electronic circuit;
identifying one or more fault suspects in the at least one scan chain of the electronic circuit; and
storing a description of the identified one or more fault suspects in the system logic and of the identified one or more fault suspects in the at least one scan chain.

17. The one or more computer-readable media of claim 16, wherein at least one of the one or more fault suspects in the system logic obscures the detectability of at least one of the fault suspects in the at least one scan chain, or wherein at least one of the fault suspects in the at least one scan chain obscures the detectability of at least one of the fault suspects in the system logic.

18. The one or more computer-readable media of claim 16, wherein the one or more fault suspects in the system logic are identified before the one or more fault suspects in the at least one scan chain are identified.

19. The one or more computer-readable media of claim 16, wherein the one or more fault suspects in the at least one scan chain are identified before the one or more fault suspects in the system logic are identified.

20. The one or more computer-readable media of claim 16, the method further comprising at least one of:
identifying one or more additional fault suspects in the system logic using the identified one or more fault suspects in the at least one scan chain; and
identifying one or more additional fault suspects in the at least one scan chain using the identified one or more fault suspects in the system logic.

21. The one or more computer-readable media of claim 16, wherein the identifying one or more fault suspects in the at least one scan chain comprises:
masking one or more potential system logic defect signals in a representation of the electronic circuit; and
using a scan chain defect diagnosis technique to identify the one or more fault suspects in the at least one scan chain.

22. The one or more computer-readable media of claim 21, wherein the masking the one or more potential system logic defect signals in the representation of the electronic circuit comprises:
identifying a set of one or more logic signals associated with the identified one or more fault suspects in the system logic; and
masking one or more logic gates in the electronic circuit corresponding to the identified set of one or more logic signals.

23. The one or more computer-readable media of claim 22, wherein the identifying the set of one or more logic signals associated with the identified one or more fault suspects in the system logic comprises identifying logic signals in one or more logic cones associated with one or more failing outputs of the system logic.

24. The one or more computer-readable media of claim 23, the method further comprising performing at least one of a union operation or an intersection operation between the identified logic signals of at least two of the logic cones.

25. The one or more computer-readable media of claim 21, wherein the masking the one or more potential system logic defect signals in the representation of the electronic circuit comprises changing one or more logic gates associated with the one or more potential system logic defects into X-mask gates.

26. The one or more computer-readable media of claim 16, wherein the identifying one or more fault suspects in the system logic comprises:
receiving a description of failing bits identified as being caused by system logic defects and not by scan chain defects;
receiving modified scan patterns, the modified scan patterns comprising scan patterns used during the testing of the electronic circuit modified to mask loading and unloading values on faulty scan chains; and
performing logic diagnosis using the description of the failing bits and the modified scan patterns.

27. The one or more computer-readable media of claim 26, the method further comprising:
modifying the scan patterns used during the testing of the electronic circuit so that loading values in scan chains comprising the fault suspects in the at least one scan chain are masked;
performing a good machine simulation of the electronic circuit using the modified scan patterns;
modifying good machine simulation results so that unloading values in the scan chains comprising the fault suspects in the at least one scan chain are masked; and
storing the modified loading and unloading values.

28. The one or more computer-readable media of claim 26, wherein the modified scan patterns are compressed scan patterns.

29. The one or more computer-readable media of claim 16, wherein the circuit comprises a compactor outputting to one or more channels, and wherein the at least one scan chain is coupled to a faulty channel via the compactor.

30. A system comprising:
a component configured to receive a failure log indicative of failing test bits observed during testing of an electronic circuit, the electronic circuit comprising system logic and one or more scan chains and having at least one defect in the system logic and at least one defect in the one or more scan chains;
a component configured to identify one or more fault suspects in the system logic of the electronic circuit; and
a component configured to identify one or more fault suspects in the one or more scan chains of the electronic circuit.

31. The system of claim 30, further comprising a component configured to transmit the log indicative of failing test bits observed during the testing of the electronic circuit.

32. One or more computer-readable media comprising storing instructions configured to cause a computer to perform a method comprising:
performing logic diagnosis on an electronic circuit while masking one or more faulty scan chains in the electronic circuit to produce logic diagnosis results;

performing scan chain diagnosis on the electronic circuit while masking one or more system logic defects in the electronic circuit to produce scan chain diagnosis results; and storing the logic diagnosis results and the scan chain diagnosis results.

33. The one or more computer-readable media of claim 32, wherein the method further comprises performing further logic diagnosis on the electronic circuit based at least in part on the scan chain diagnosis results.

34. The one or more computer-readable media of claim 32, wherein the method further comprises performing further scan chain diagnosis on the electronic circuit based at least in part on the logic diagnosis results.

35. The one or more computer-readable media of claim 32, wherein the electronic circuit comprises a compactor.

36. A method, comprising:

receiving a failure log indicative of failing test bits observed during testing of an electronic circuit;

performing chain diagnosis for at least one scan chain to produce chain diagnosis results, the chain diagnosis results comprising one or more scan chain fault suspects;

determining scores for one or more of the scan chain fault suspects, the score for a respective one of the scan chain fault suspects indicating whether the respective scan chain fault suspect completely or partially explains the failing test bits observed; and storing the scores in one or more computer-readable media.

37. The method of claim 36, wherein the scores are determined on a pattern-by-pattern basis.

38. The method of claim 36, wherein the scores are determined using bit-based scoring.

39. The method of claim 36, further comprising reducing the number of scan chain fault suspects from the scan chain results using the determined scores.

40. One or more computer-readable media storing the scores determined by the method of claim 36.

41. One or more computer-readable media storing instructions configured to cause a computer to perform a method, the method comprising:

receiving a failure log indicative of failing test bits observed during testing of an electronic circuit;

performing chain diagnosis for at least one scan chain to produce chain diagnosis results, the chain diagnosis results comprising one or more scan chain fault suspects;

determining scores for one or more of the scan chain fault suspects, the score for a respective one of the scan chain fault suspects indicating whether the respective scan chain fault suspect completely or partially explains the failing test bits observed; and storing the scores.

42. The one or more computer-readable media of claim 41, wherein the scores are determined on a pattern-by-pattern basis.

43. The one or more computer-readable media of claim 41, wherein the scores are determined using bit-based scoring.

44. The one or more computer-readable media of claim 41, the method further comprising reducing the number of scan chain fault suspects from the scan chain results using the determined scores.

45. A method for diagnosing system logic faults in an electronic circuit, the method comprising:

receiving test results obtained by applying scan pattern loading values to the electronic circuit during testing, the test results including failing bits caused by one or more system logic defects in the electronic circuit;

receiving modified scan patterns, the modified scan patterns comprising the scan pattern loading values modified such that values loaded into faulty scan chains have an unknown value, the modified scan patterns further comprising scan pattern unloading values modified such that values unloaded from the faulty scan chains have the unknown value; and performing system logic diagnosis of the electronic circuit using the failing bits caused by the one or more system logic defects and the modified scan patterns.

46. The method of claim 45, wherein the scan pattern unloading values are obtained by performing a good machine simulation using the modified loading values.

47. The method of claim 45, further comprising performing chain diagnosis of the electronic circuit using results from the system logic diagnosis.

48. The method of claim 45, further comprising:

receiving a failure log indicative of failing test bits observed during testing of the electronic circuit with the scan pattern loading values; and evaluating the failing test bits in the failure log to identify the failing bits caused by the one or more system logic defects in the circuit.

49. One or more computer-readable media storing the description of the identified one or more fault suspects in the system logic and of the identified one or more fault suspects in the at least one scan chain identified by the method of claim 45.

50. One or more computer-readable media storing instructions configured to cause a computer to perform a method, the method comprising:

receiving test results obtained by applying scan pattern loading values to the electronic circuit during testing, the test results including failing bits caused by one or more system logic defects in the electronic circuit;

receiving modified scan patterns, the modified scan patterns comprising the scan pattern loading values modified such that values loaded into faulty scan chains have an unknown value, the modified scan patterns further comprising scan pattern unloading values modified such that values unloaded from the faulty scan chains have the unknown value; and performing system logic diagnosis of the electronic circuit using the failing bits caused by the one or more system logic defects and the modified scan patterns.

51. The one or more computer-readable media of claim 50, wherein the scan pattern unloading values are obtained by performing a good machine simulation using the modified loading values.

52. The one or more computer-readable media of claim 50, the method further comprising performing chain diagnosis of the electronic circuit using results from the system logic diagnosis.

53. The one or more computer-readable media of claim 50, the method further comprising:

receiving a failure log indicative of failing test bits observed during testing of the electronic circuit with the scan pattern loading values; and evaluating the failing test bits in the failure log to identify the failing bits caused by the one or more system logic defects in the circuit.

54. A method of analyzing data from a test of an electronic circuit having one or more system logic defects and one or more scan chain defects, the data indicating the presence of the one or more system logic defects and the one or more scan chain defects, the method comprising:
- identifying from the data a group of one or more failing bits determined as being caused by the one or more system logic defects; and
- storing the identified group of one or more failing bits in one or more computer-readable media.

55. The method of claim 54, wherein the identifying from the data the group of one or more failing bits determined as being caused by the one or more system logic defects comprises:
- identifying a faulty scan chain or a faulty output channel in the electronic circuit;
- modifying a representation of the electronic circuit such that scan cells in the identified faulty scan chain or coupled to the identified faulty output channel always output an unknown value;
- simulating one or more scan patterns using the modified representation to produce simulation results; and
- based on the simulation results, identifying the group of the one or more failing bits determined as being caused by the one or more system logic defects.

56. The method of claim 55, wherein the identifying the group of the one or more failing bits determined as being caused by the one or more system logic defects comprises identifying a selected failure bit as being caused by the one or more system logic defects if the selected failure bit is located on a good scan chain, on a good channel, or at a primary output, and if the simulation results corresponding to the selected failure bit do not comprise an unknown value.

57. One or more computer-readable media storing a description of the one or more failing bits determined as being caused by the one or more system logic defects by the method of claim 54.

58. One or more computer-readable media storing instructions configured to cause a computer to perform a method of analyzing data from a test of an electronic circuit having one or more system logic defects and one or more scan chain defects, the data indicating the presence of the one or more system logic defects and the one or more scan chain defects, the method comprising:
- identifying from the data a group of one or more failing bits determined as being caused by the one or more system logic defects; and
- storing the identified group of one or more failing bits.

59. The one or more computer-readable media of claim 58, wherein the identifying from the data the group of one or more failing bits determined as being caused by the one or more system logic defects comprises:
- identifying a faulty scan chain or a faulty output channel in the electronic circuit;
- modifying a representation of the electronic circuit such that scan cells in the identified faulty scan chain or coupled to the identified faulty output channel always output an unknown value;
- simulating one or more scan patterns using the modified representation to produce simulation results; and
- based on the simulation results, identifying the group of the one or more failing bits determined as being caused by the one or more system logic defects.

60. The one or more computer-readable media of claim 59, wherein the identifying the group of the one or more failing bits determined as being caused by the one or more system logic defects comprises identifying a selected failure bit as being caused by the one or more system logic defects if the selected failure bit is located on a good scan chain, on a good channel, or at a primary output, and if the simulation results corresponding to the selected failure bit do not comprise an unknown value.

* * * * *